(12) United States Patent
Shachar et al.

(10) Patent No.: US 11,358,140 B2
(45) Date of Patent: *Jun. 14, 2022

(54) APPARATUS FOR AUTOMATIC SAMPLING OF BIOLOGICAL SPECIES EMPLOYING AN AMPLIFICATION WITH A MAGNETIC NANOPARTICLE AND PROPULSION METHOD

(71) Applicant: Autonomous Medical Devices Inc., Santa Monica, CA (US)

(72) Inventors: Josh Yehoshua Shachar, Santa Monica, CA (US); Sam Gurley, South Pasadena, CA (US); Aaron Cipriano, Fullerton, CA (US); Peter Yin, Culver City, CA (US); Rob Purnell, Los Angeles, CA (US); Marc Rocklinger, Marina del Rey, CA (US); Ming Petrullo, Redondo Beach, CA (US); Stelica Stelea, Yorba Linda, CA (US); Marlon S. Thomas, Riverside, CA (US)

(73) Assignee: Autonomous Medical Devices Inc., Santa Ana, CA (US)

( * ) Notice: Subject to any disclaimer, the term of this patent is extended or adjusted under 35 U.S.C. 154(b) by 518 days.

This patent is subject to a terminal disclaimer.

(21) Appl. No.: 16/152,029

(22) Filed: Oct. 4, 2018

(65) Prior Publication Data

US 2019/0030533 A1 Jan. 31, 2019

Related U.S. Application Data

(63) Continuation-in-part of application No. 15/597,090, filed on May 16, 2017, now abandoned.

(Continued)

(51) Int. Cl.
*B01L 3/00* (2006.01)
*G01N 29/02* (2006.01)
(Continued)

(52) U.S. Cl.
CPC ..... *B01L 3/502715* (2013.01); *B01L 3/50273* (2013.01); *B01L 3/502761* (2013.01);
(Continued)

(58) Field of Classification Search
CPC .......... B01L 3/502715; B01L 3/50273; B01L 3/502761; B01L 2300/0816;
(Continued)

(56) References Cited

U.S. PATENT DOCUMENTS 7,878,063 B1 2/2011 Cular et al.
8,436,509 B1 5/2013 Branch
(Continued)

FOREIGN PATENT DOCUMENTS

EP 2284539 2/2011

OTHER PUBLICATIONS

Neeves et.al., Dilation and degradation of brain extracellular matrix enhances penetration of infused polymer nanoparticles, Brain Research, Elsevier, Amsterdam, NL,ISSN: 0006-8993 , J.Brainres.2007.08.050.

*Primary Examiner* — Jill A Warden
*Assistant Examiner* — Dwayne K Handy
(74) *Attorney, Agent, or Firm* — Marcus C. Dawes; Daniel L. Dawes

(57) ABSTRACT

An cartridge is combined with a smart device which is capable of communicating with a network to perform a portable, fast, field assay of a small sample biological analyte. A closed microfluidic circuit for mixes the analyte with a buffer with functionalized magnetic beads capable of being specifically combined with the analyte. A detector (Continued)

communicates with the microfluidic circuit in which the mixed analyte, buffer and combined functionalized magnetic beads are sensed. A microcontroller is coupled to detector for controlling the detector and for data processing an output assay signal from the detector. A user interface communicates with the microcontroller for providing user input and for providing user output through the smart device to the network.

18 Claims, 19 Drawing Sheets

Related U.S. Application Data

(60) Provisional application No. 62/597,202, filed on Dec. 11, 2017.

(51) Int. Cl.
*G01N 29/036* (2006.01)
*H03H 9/145* (2006.01)
*G01N 29/24* (2006.01)
*G01N 29/024* (2006.01)
*G01N 29/22* (2006.01)
*H03H 9/05* (2006.01)
*H03H 9/10* (2006.01)
*H03H 9/02* (2006.01)

(52) U.S. Cl.
CPC ......... *G01N 29/022* (2013.01); *G01N 29/024* (2013.01); *G01N 29/036* (2013.01); *G01N 29/222* (2013.01); *G01N 29/226* (2013.01); *G01N 29/2462* (2013.01); *H03H 9/058* (2013.01); *H03H 9/0576* (2013.01); *H03H 9/1064* (2013.01); *H03H 9/14502* (2013.01); *H03H 9/14505* (2013.01); *B01L 2200/0668* (2013.01); *B01L 2300/0681* (2013.01); *B01L 2300/088* (2013.01); *B01L 2300/0816* (2013.01); *B01L 2400/043* (2013.01); *B01L 2400/0436* (2013.01); *B01L 2400/0478* (2013.01); *G01N 2291/0255* (2013.01); *G01N 2291/0256* (2013.01); *G01N 2291/02466* (2013.01); *G01N 2291/0423* (2013.01); *H03H 9/02866* (2013.01)

(58) Field of Classification Search
CPC ....... B01L 2300/088; B01L 2400/0436; B01L 2200/0668; B01L 2300/0681; B01L 2400/043; B01L 2400/0478; H03H 9/1064; H03H 9/14502; H03H 9/058; H03H 9/0576; H03H 9/14505; H03H 9/02866; G01N 29/2462; G01N 29/024; G01N 29/226; G01N 29/222; G01N 29/022; G01N 29/036; G01N 2291/02466; G01N 2291/0255; G01N 2291/0256; G01N 2291/0423
See application file for complete search history.

(56) References Cited

U.S. PATENT DOCUMENTS

| | | |
|---|---|---|
| 2003/0190608 A1 | 10/2003 | Blackburn |
| 2006/0008382 A1* | 1/2006 | Salamitou ......... B01L 3/502715 422/400 |
| 2006/0205061 A1* | 9/2006 | Roukes ............ G01N 33/54366 435/287.2 |
| 2007/0183934 A1 | 8/2007 | Diercks et al. |
| 2008/0182301 A1* | 7/2008 | Handique ......... B01L 3/502723 435/91.2 |
| 2010/0075347 A1 | 3/2010 | Dasaratha et al. |
| 2011/0053289 A1* | 3/2011 | Lowe .................. G01N 33/558 436/501 |
| 2011/0223583 A1 | 9/2011 | Gordon |
| 2012/0329142 A1* | 12/2012 | Battrell ................. C12Q 1/686 435/287.2 |
| 2015/0057952 A1* | 2/2015 | Coombs ............... G01N 29/226 702/38 |

* cited by examiner

APPARATUS FOR AUTOMATIC SAMPLING OF BIOLOGICAL SPECIES EMPLOYING AN AMPLIFICATION WITH A MAGNETIC NANOPARTICLE AND PROPULSION METHOD

RELATED APPLICATIONS

The present application is related to U.S. Provisional Application Ser. No. 62/597,202, filed on Dec. 11, 2017, which is incorporated herein by reference and to which priority is claimed pursuant to 35 USC 119 and which is a continuation in part of U.S. patent application Ser. No. 15/597,090, filed on May 16, 2017, all of which are incorporated herein by reference and to which priority is claimed pursuant to 35 USC 120.

BACKGROUND

Field of the Technology

The invention relates to the field of surface acoustic wave (SAW) analyzers for use as handheld, field portable analyzers communicated through conventional cellphones, tablets, iPad or other internet connected devices to the cloud, and methods of operating the same. More particularity, the invention is directed to the use of a microfluidic cartridge that overcomes the diffusive limitation of a particle suspended in a fluid from combining with an antibody on a sensor surface by using magnetic particles introduced into a magnetic field in a fluid to enable combination with the antibody. The use of a microfluidic circuit enables a series of sequences required for an ELISA-like immunoassay sandwich to be formed from a complex serum, such as blood, saliva or urine, onto a sensor surface.

Description of the Prior Art

The aim of setting humanity on the path to autonomous healthcare for the individual is clearly constrained by existing socioeconomical and geographical parameters. The ability of an individual, as well as entire communities, to be measured by their access to active diagnostic screenings of potential maladies as an asymptomatic expression is the hallmark of this technology. The technology is defined by the measure of the immediacy of its success in a healthcare system. This quantitative measure of "Health" is defined by the access these communities have to such diagnostic medical practices.

As disclosed below access to easy, portable and on demand medical diagnostics is possible, but from development to distribution, many of technological undertakings look only to communities of affluent individuals in the developed markets as their target market, while poor and under-developed markets are deprived of all but the most basic or are limited to a trickle down of medical necessities. The development of a portable, automated screening apparatus with accessibility spanning broad swaths of socioeconomic levels and geographies is an object of the invention and is described under the heading of "Democratization of Diagnostic Medicine".

The path for the technology to enable an individual to test his or her medical conditions has previously been contingent on the ability to reduce the complexity of biochemical or biological tests by screenings of bodily fluids through the use of the services of an institutional laboratory. This illustrated embodiments of the invention described below center on transferring such processes to a field, automated portable, disposable apparatus operated by an unskilled user.

The challenge is not solely an issue of elimination of the use of large or complex lab equipment and highly trained lab personnel, but requires surmounting a myriad of physical, biochemical and other inherent constraints outlined below to which illustrated embodiments of the invention are intended to provide a solution.

The automation of biochemical sequencing to detect the presence of a virus, protein, exosome DNA or RNA within a complex assay of blood, saliva, urine or any other bodily fluids does not merely involve the geometrical and metric miniaturization of preexisting equipment, but involves overcoming limitations of many laws of physics, such as the limitations imposed: (1) by the diffusion coefficient of an analyte (determined by viscosity, particle size, and temperature); (2) by flow characteristics of the bodily fluid sample (the modeling of rate of flow relative to conjugation rate); (3) by the inherent association and dissociation of a particular analyte to its antibody (Kd); and (4) by ultimately providing for a system and method, which addresses the clinical resolution of the measuring apparatus, where through its principles of its operation, it can discern between false positive and false negatives results employing artificial intelligence algorithm to form a decision from the data generated by the system.

SUMMARY

The illustrated embodiments of the invention include a system for performing a portable, fast, field assay of a small sample biological analyte having a microfluidic cartridge used with an electronic smart device.

In one embodiment of the invention includes a method of using a system which in turn includes: a closed microfluidic circuit for mixing and homogenizing the analyte with a buffer while using functionalized magnetic beads; a syringe pump for transporting the analyte bearing fluid to the detector; a pump interface circuit coupled to the syringe pump that delivers DC current from a microcontroller to the pump to induce a displacement change and to drive fluid through the various components of the circuit; a filtration screen where large blood cells are trapped, allowing for a fluidic serum of plasma and analyte to flow therethrough; a mixing chamber whereby the magnetic nanoparticles and the analyte are homogenized to allow for conjugation to occur; a shear horizontal surface acoustic wave (SAW) detector communicated with the microfluidic circuit and having a plurality of channels including at least one functionalized sensing lane in which the mixed analyte and buffer flows and is sensed, and having at least one nonfunctionalized reference lane in which the mixed analyte and buffer flows; a SAW interface circuit coupled to the shear horizontal surface acoustic wave (SAW) detector; a retractable permanent magnet located above the SAW that is movable perpendicular to the SAW surface; a microcontroller coupled to the SAW interface, to the syringe pump, to the mixing chamber and to the movable permanent magnet for controlling the SAW detector through the SAW interface circuit, and where the microcontroller is used for data processing an output assay signal from the SAW detector; and a user interface communicated with the microcontroller for providing user input and for providing user output through the smart device.

The closed microfluidic circuit of the microfluidic cartridge includes: a microfluidic chamber where the analyte bearing sample, buffer and functionalized mass amplifying magnetic beads are combined (an immunoassay sandwich is formed out of the functionalized magnetic nanoparticles, target analytes, and immobilized secondary antibody specific for the target analyte); a filtration membrane coupled to the microfluidic circuit for separation of the red and white blood cells from plasma, buffer, analyte and magnetic beads in a serum of blood; an active mixer coupled to the microfluidic chamber for mixing the analyte bearing plasma, buffer and functionalized magnetic beads into a homogenous mixture to enable capture of the analyte by the functionalized magnetic beads to form an immunoassay half sandwich consisting of a functionalized magnetic nanoparticle and a target analyte; a syringe pump for providing for a positive pressure of the mixture in the closed microfluidic circuit to drive the fluid through the separation membrane and transfer the analyte, buffer and functionalized magnetic beads toward the shear horizontal surface acoustic wave (SAW) detector; a sensing chamber whereby the surface of the functionalized SAW is exposed to the flow through fluidic circuit to allow for capture on the analyte magnetic bead conjugates from the fluid onto the sensor generating an immunoassay; a permanent magnet located above the SAW sensor to draw magnetic particles suspended in the sensing chamber onto the surface of the SAW sensor; a traveling arm mechanism that allows for the permanent magnet or electromagnet to exert the magnetic field flux density to drive the magnetic nanoparticles to the surface of sensor (the inverse square law of magnetic force is used so that the variation of the distance of the magnet to its target and/or electromagnetic intensity applies a variable force on the magnetic nanoparticles); and a waste reservoir where fluid expelled from the sensing chamber is stored.

In one embodiment the microfluidic chamber includes a double membrane blood filtration module, whereby two membranes of differing thicknesses allow for the separation of blood to occur while preventing a buildup on the surface resulting in a pressure decrease.

In one embodiment the plurality of channels in the SAW detector include one reference lane and three functionalized sensing lanes, with each lane being functionalized to a different target allowing for the multiplexing of testing targets on a single chip.

In one embodiment the system further includes a bubble trap membrane to degas the fluid before it is passed over the SAW sensor.

In one embodiment, the active mixer comprises of a rotary propeller mechanism in the mixing chamber to allow for rapid homogenization of the analyte and magnetic bead via turbulence induced by the rotation of the fluid.

In an alternative embodiment the active mixer comprises a piezo-pump and piezo-mixer used to agitate the fluid in the mixing chamber to homogenize the sample.

In one embodiment, an electromagnet is attached to the bottom of the sensing chamber to remove any nonspecifically bound magnetic beads from the sensor surface before the fluid is transported from the sensing chamber to the waste reservoir.

In one embodiment the closed microfluidic recirculates the mixed analyte and buffer through the closed microfluidic circuit, whereby a microcontroller embedded within the reader commands the permanent or electromagnet to activate a cycling of the magnetic field to enable attraction and relaxation of the magnetic beads circulating within the chamber a multiplicity of times within a predetermined time period less than one hour in duration to allow for increased capture.

In one embodiment the system further includes a power module coupled to the microcontroller and SAW interface circuit for providing electrical power.

In one embodiment the system further includes peripherals coupled to the microcontroller including a memory, a temperature sensor, a humidity sensor, a real time clock, a cooling fan, and an in-circuit serial programming ICSP logic module.

In one embodiment the user interface includes a Wi-Fi module and antenna coupled to the Wi-Fi module, a capacitive touch screen, a color thin-film transistor display and a graphic controller with memory coupled to the thin-film transistor display with a backlight source.

In one embodiment the user interface includes an audio module with a speaker coupled thereto, a serial data card interface, an inertial motion unit, at least one RGB LED, and at least one program switch.

In one embodiment the SAW interface circuit includes a clock oscillator, an RF synthesizer coupled to the clock oscillator, a low pass filter and splitter having an input coupled to the RF synthesizer and an output coupled to the SAW detector, a phase/gain detector coupled to the low pass filter and splitter and having a data input coupled to the SAW detector, an analog-to-digital converter having an input coupled to an output of the phase/gain detector and having an output coupled to the microcontroller, a pump driver, and a motor with a motor driver for mechanically loading the microfluidic cartridge components.

The illustrated embodiment also includes an apparatus in combination with a smart device which is capable of communicating with a network. The apparatus performs a portable, fast, field assay of a small sample biological analyte and includes: a closed microfluidic circuit for mixing the analyte with a buffer with functionalized magnetic beads capable of being specifically combined with the analyte; a detector communicated with the microfluidic circuit in which the mixed analyte, buffer and combined functionalized magnetic beads are sensed; a microcontroller coupled to detector for controlling the detector and for data processing an output assay signal from the detector; and a user interface communicated with the microcontroller for providing user input and for providing user output through the smart device to the network.

In one embodiment the closed microfluidic circuit includes: a microfluidic chamber where the analyte and functionalized magnetic beads are combined; an active mixer coupled to the microfluidic chamber for mixing the analyte, functionalized magnetic beads, and buffer into a homogenous mixture; a membrane filter for separating the whole blood cells from the plasma serum containing the analyte; a syringe pump for providing for a positive pressure of the mixture in the closed microfluidic circuit to transfer the analyte, buffer, plasma and functionalized magnetic beads toward the detector; a movable permanent magnet for drawing the captured magnetic beads onto the detector to allow conjugation of the functionalized captured magnetic beads with the detector to allow a final measurement to be made; and a waste reservoir.

In one embodiment the smart device provides software-controlled user input control and data functions and provides software-controlled user output data functions for the apparatus.

The illustrated embodiments also include a method of operating a medically diagnostic system used with a smart device capable of communicating with a network, the medical diagnostic system for performing a portable, fast, field assay of a small sample biological analyte, the method includes the steps of: mixing the analyte, functionalized magnetic beads, and buffer into a homogenous mixture, wherein at least some of the functionalized magnetic beads capture the analyte; transferring the analyte, buffer and functionalized magnetic beads toward a detector; disposing the captured magnetic beads into the detector to allow conjugation of the functionalized captured magnetic beads with the detector; removing uncaptured magnetic beads and other noninteracting components of the analyte or buffer from the detector; and measuring the amount of conjugated functionalized captured magnetic beads in the detector.

In one embodiment the step of mixing includes using microimpellers, electro-kinetic sources such as electrohydrodynamics, electroosmotic or dielelctrophoretic mechanisms, using acoustic ultrasonic sources, using thermal sources, magnetic sources such as magnetohydrodynamic or magnetophoretic mechanisms, or pressure sources as the mixing force in a mixer. More particularly the step of mixing may include using an electrical field as the mixing force in a mixer with a conductive sidewall, using a ferro field flow, using circular copper electrodes, an asymmetric lateral structure or a floating electrode, all of which are conventional means for mixing a fluid. The step of mixing further includes using a pressure field as the mixing force in a mixer using pulse width modulation, a Braille pin actuator, a rotary peristaltic micropump or single chamber micropumps, all of which are conventional means for mixing a fluid. The step of mixing may include using a magnetic field as the mixing force in a mixer using a permanent magnet, magnetohydrodynamic actuation, a rotating magnetic field, a hybrid gradient magnetic field or rotating magnetic microbeads, all of which are conventional means for mixing a fluid. The step of mixing further includes using an acoustic field as the mixing force in a mixer using bubble cavitation, a vibrating membrane, bubbles, micro-pillars or sharp edges, all of which are conventional means for mixing a fluid.

The step of separating may include: acoustophoresis using acoustic pressure to achieve separation based on size, density or compressibility of the constituents; dielectrophoresis using inhomogenous electrical fields to achieve separation based on size or polarizability of the constituents: magnetophoresis using inhomogenous magnetic fields to achieve separation based on size or magnetization of the constituents; mechanical forces using gravity or centrifugation to achieve separation based on size or density of the constituents; or optophoresis using an optical force to achieve separation based on size or refractive index of the constituents.

In one embodiment the step of transferring uses a mechanism employing: air propulsion such as: a heat thermal bubble or mechanical meniscus micropump; a mechanical piston; a micropneumatic pump employing peristaltic membranes; capillary structures; magnetic bead transport such as linear magnetic motors, rotating magnetic arrays, rotating magnetic actuators; syringe-piston membranes; piezo pumps; or magnetic field inductive drivers.

In another embodiment the method further includes the steps of: recirculating the analyte, functionalized magnetic beads, and buffer through a microfluidic circuit to repeat the steps of mixing the analyte, functionalized magnetic beads, and buffer into a homogenous mixture, wherein at least some of the functionalized magnetic beads capture the analyte; separating the captured magnetic beads combined with the analyte from uncaptured magnetic beads not combined with the analyte; transferring the analyte, buffer and functionalized magnetic beads toward a detector; disposing the captured magnetic beads into the detector to allow conjugation of the functionalized captured magnetic beads with the detector; removing uncaptured magnetic beads and other noninteracting components of the analyte or buffer from the detector; and measuring the amount of conjugated functionalized captured magnetic beads in the detector.

In one embodiment, the step of performing magnetically actuated conjugation uses either an electromagnet or a permanent magnet. The magnetic field magnitude e.g. 0.5 Tesla, is used in the current embodiment, but other values are contemplated as expressly being within the scope of the invention where the magnetic field strength is based on geometrical parameters associated with the microfluidic device. In the event of a permanent magnet, due to the inverse square law nature of a magnetic field strength, the field strength rapidly falls off with the distance. The permanent magnet is able to travel far enough away from the sensor surface such that the magnetic field strength is comparable to the background magnetism, for example 500 Gauss. This allows for the device to vary the magnetic field strength at the sensor surface using microprocessor control of the magnet's position.

The fluid is transported in discrete volumes, for example 50 ul, per stroke, thus giving the suspended magnetic nanoparticles time to reach the sensor surface via the control of the magnetic force which then reduces the diffusion coefficient penalty by providing an instantaneous translation of the magnetic nanoparticles from anywhere in the chamber volume to the targeted surface of the SAW sensor. This enables the immunoassay sandwich to conjugate on the sensor surface, and additionally allows for even coverage of the sensor and reduces any inconsistencies caused from the combination of magnetics and fluid flow simultaneously.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The disclosure can be better visualized by turning now to the following drawings wherein like elements are referenced by like numerals.

Figure 1:
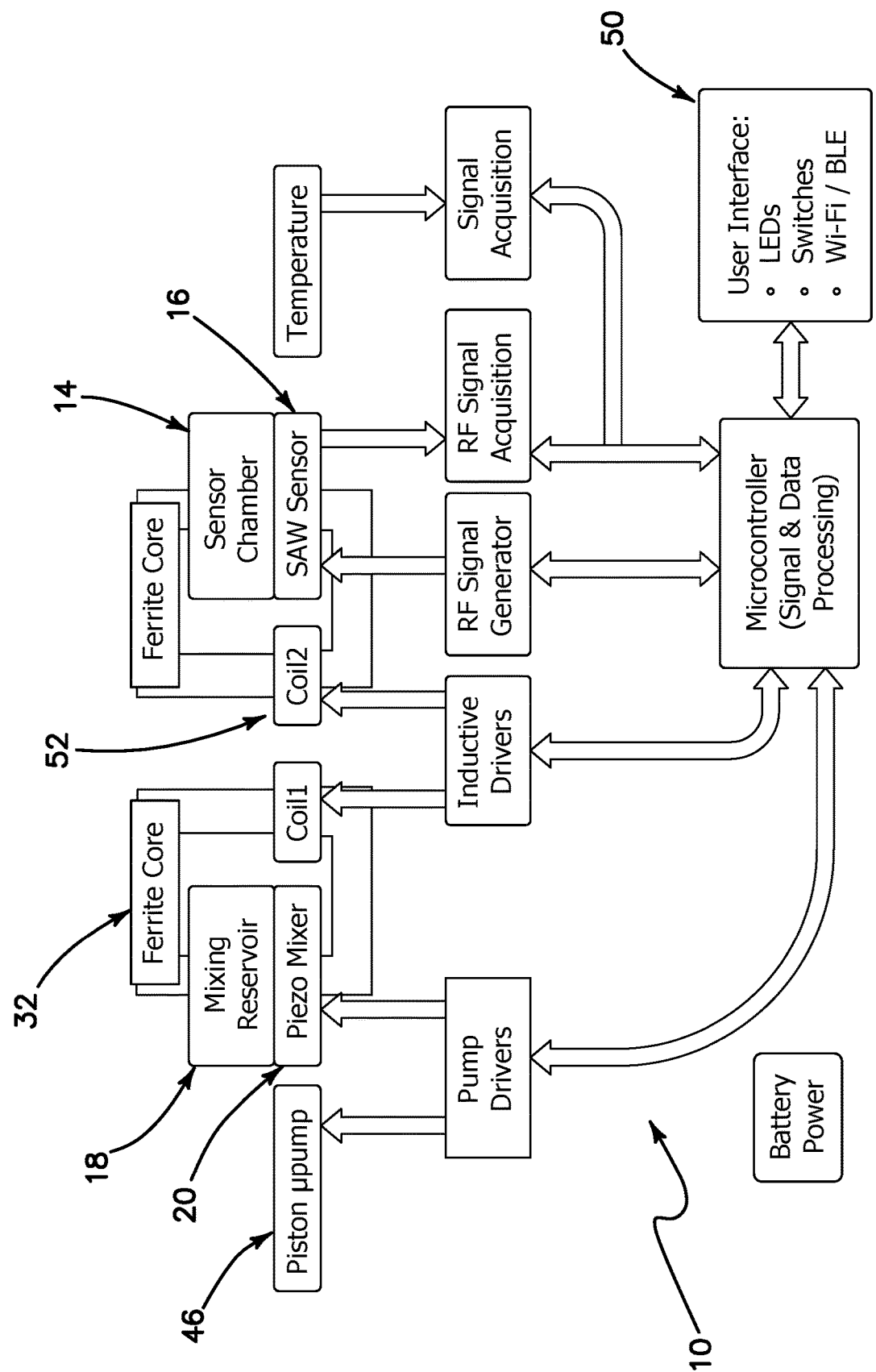
FIG. 1 is a high-level block diagram of the principal components of the invention.

The disclosure and its various embodiments can now be better understood by turning to the following detailed description of the preferred embodiments which are presented as illustrated examples of the embodiments defined in the claims. It is expressly understood that the embodiments as defined by the claims may be broader than the illustrated embodiments described below.

DETAILED DESCRIPTION OF THE PREFERRED EMBODIMENTS

Lab-on-Chip (LoC) Devices

LoC devices have a particular importance in the application of personal diagnostics. The illustrated embodiments mainly focus on DNA analysis and human disease diagnostics. The illustrated LoC modality has been designed from the ground up to be readily used in different areas such as in diagnostics, bioanalysis, and biosensing for environmental monitoring including testing of water and food quality, for testing of drugs, in pharmaceutic monitoring, and for applications not yet known. It has the advantage of low power consumption, portability, modularity, reconfigurability, and automates the laboratory processes like sample transport, dispensing and mixing, reducing the time and prerequisite necessities of laboratory tests.

SAW Sensor, Microfluidic and "Lab on a Chip"

The narrative of democratizing diagnostic medicine is in the context of limitations posed by the boundary conditions of the biochemical process, coupled with the fact that such complex operations must be conducted in the field by an untrained patient. Solving these technical challenges, as well as the ability of such apparatus to be realized as a handheld, label free device without the preparatory steps customarily conducted in a laboratory setting, are resolved by an understanding the internal physical, biological and chemical principles that govern such complex process as disclosed below.

While contemplating the entire biochemical reaction between an analyte and its specific antibody, we must answer a set of questions which fundamentally and inherently define the process. This involves the rate of hybridization (the association and dissociation of the chemical process K+/K−, the effect of the diffusion coefficient (D), the flow characteristics of the buffer with its associated biological agent (Navier-Stocks Equation), the physical principles governing the sensing modality (florescent, PCR, ELISA, SPR, optical, resistive, capacitive etc.), and the entire biochemical process and its time duration. The challenges that need to be addressed to employ the illustrated biosensor are mixing, separation, transfer, conjugation and clean up.

Love Wave, Sheer Horizontal Surface Acoustic Wave Biosensor

In the illustrated embodiment a class of acoustic sensors, generally known as a Love Wave-sheer horizontal surface acoustic wave (SH-SAW) biosensor, is the detector type selected for development. It must be understood that other types of sensors could be employed without departing from the spirit and scope of the invention. The SH SAW biosensor was selected for its ability to resolve small mass accumulations over the sensing lanes and for a resolution to account for biological species with mass accumulation on the order of picograms (10-12 g) to femtograms (10-15 g). The biosensor is intended to deployed in a field setting, where the operator inserts a fluid sample, such as saliva, blood, urine or any combination of biological specimen, without the customary use of laboratory environment. The biosensor performs the entire biochemical test sequences in an automated basis using a "Lab on a Chip" modality. The biosensor device is self-analyzing and transmits the test results wirelessly to the cloud for further use and therapeutic response by the local or remote physician, institution and data collection protocol.

The biosensor device utilizes interactive algorithms to analyze data while employing artificial intelligence (AI) routines, so that the complex variabilities of human disease conditions are sorted based on background data, nested as parametric discriminators in a form of a "Look-Up-Tables". Sorting is performed using statistical measures as: genders, age, geographical location, ethnicity and other relevant medical input parameters to narrow the Gaussian errors associated with population variance.

The aim of "diagnostic on the fly" means that the biosensor device is capable of overcoming the biophysical limited time scales during which the test is conducted (the diagnostic test should be performed within about 10 minutes of sample introduction). The apparatus acts as "lab on a chip" and performs the necessary steps of separating the complex assay of blood, saliva, urine or and body fluids into its components (gross separation), then the reduced assay is physically delivered to a chamber, a method for amplification of the analyte in question is then performed, and the combined immunoassay complex is transferred to a sensing chamber.

Detection

The detection limit (LOD) is an essential element of the biomolecular assay and sensor development. The pressure to push the detection limit of bioanalytical techniques to lower levels, while increasing resolution, is largely driven by a demand for new molecular diagnostic tests for early stage cancer detection and diagnosis. At early stages of cancer development, the amount of cancer biomarker molecules released from the tumor to the blood or other biological fluids is very small. Naturally, one assumes that a more sensitive analytical technique that can "catch" these biomarkers at lower concentrations will allow diseases to be detected earlier. Under this general premise, pursuing lower level detection limits has become a major goal of new bioanalytical technology development, particularly in this application where the use of a biomass having a specificity to a predetermined analyte employs a mass amplifier using orthogonal antibody fragments to respond to the analyte, thereby increasing its detectable mass proportional to the bound analyte to its antibody in the form of a traditional ELISA sandwich. It is not uncommon to see detection limits in the fg-pg ml-1 range for protein antigens, and sometimes even down to the single molecule level.

While pursuing bioanalytical techniques and products with higher sensitivities and lower detection limits, it's important to ask a critical question: is the claimed/expected detection limit theoretically achievable? If by theory, an analytical method cannot possibly achieve the sensitivity as claimed, attempted use of such methods for expected high sensitivity analysis can only lead to a frustration of research effort and resources, and sometimes, misleading results. The issue of limited available biological specimen defined by its concentration (within the acquis volume) and the ability of the detector to sense such limited presence of the antigen is determined by the test apparatus resolution. These and other considerations limit our ability to measure concentration of biological species in the order of pg-ng ml-1.

Detecting biochemical species with LOD ranging from femtogram to picogram values is mandated by the needs of early detection of biological species (biomarkers present in blood, saliva, urine or other bodily fluids), where such species are invariably marked by their low concentration value (Cminimum). Through experimentation, it has been discovered that the limit of detection (LOD) of the SH-SAW sensor is roughly on the order of one picogram. This arises from the frequency used (375 MHz) in the SAW sensor such that resolution is maximized, but elastic energy does not escape the lanes and interfere with detection. For a measurement to be deemed statistically significant by the National Institute of Standards and Technology (NIST), a signal value must be three times stronger than any background noise that is present on the device. The LOD therefore arises from this relationship set forth by the National Institute for Standards, (NIST), whereby the operational frequency (e.g. 325 MHz) and the phase shift of the signal as detected by the embodiment of employing a surface acoustic wave sensor is thereby reduced to the following equation:

$$LOD=(3\times Nf/S\sigma\phi\times\phi0)\Delta\sigma r=3\times Nf/(S\sigma\phi\times\phi0).$$

Where Nf is the operational frequency, S$\phi\sigma$ is the sensitivity of the device with reference to phase and standard deviation, $\sigma r$ is standard deviation of the reference signal, $\phi$ is the phase measurement obtained from the surface acoustic wave sensor, $\phi 0$ is unmodulated phase (reference), $\Delta\sigma r$ is the spread of acceptable standard deviation as imposed by the NIST (Signal must be 3× above the background noise).

Diffusion Coefficient (D) and Fluidic Transport

The major limitation arising from the requirement for a short testing time (10 minutes) is the limits of diffusivity. Diffusivity or the diffusion coefficient, is a proportionality constant of the flux of a concentration (such as a test analyte) due to its molecular properties over the gradient in the concentration of the species (the driving force for diffusion). Diffusion limits the speed at which analyte can fall out of suspension onto the sensor surface. Left to be unperturbed by our device, the mass amplifiers could take hours to fully diffuse thorough the fluid sample and interact with the target analyte. Hence, the first step is a mixing event to homogenize the sample and the buffer. There are many ways to provide this function, such as through microfluidic recirculation to continually perturb the concentration gradient and induce mixing in the fluidic pathway, or using external forces on the sample, such as by using an electromagnet to agitate magnetic beads, or by having a motorized stirring component.

The biosensor is specifically engineered to the analytes in the fluid motion and its behavior. The Navier-Stokes Equations are a set of conservation equations that dictate the behavior of fluid motion. By simultaneously solving both for conservation of momentum and mass, the behavior of the fluid flow can be obtained. For a Newtonian fluid, the momentum conservation is expressed as:

$$\rho(\partial u/\partial t+u\cdot\nabla u)=-\nabla p+\nabla\cdot(\mu(\nabla u+(\nabla u)T)-2/3\mu(\nabla-u)I)+F,$$

Where $\rho$ is the density of the fluid, u is the velocity vector of the fluid, t is time, p is pressure, $\mu$ is the fluid viscosity, T is temperature, I is the inertial force of the fluid, and F are externally applied forces.

While the conservation of mass is expressed as:

$$\partial\rho/\partial t+\nabla(\rho u)=0$$

For the momentum equation above, the terms represent (1) inertial forces, (2) pressure forces, (3) viscous forces, and (4) external forces. For application in microfluidic flow modeling, a second principle must be introduced to reduce the equation so that it can numerically be computed and utilized in the design stage of development. The Reynolds number, Re, is a dimensionless number that expresses the ratio of 1) inertial forces to 2) viscous forces. It can be calculated from the equation:

$$Re=\rho uL/\mu$$

where $\rho$ is the fluid density (kgm3), u is the fluid velocity (m/s), L is the characteristic linear dimension of the application (m), and $\mu$ is the dynamic viscosity (Pa·s). For Re<1, viscous forces dominate, and the flow is laminar. For this application, the computed Re is low. Therefore, for the Navier-Stoke fluid transport equation for this application, the inertial term (1) and external forces (4) are neglected. Additionally, the incompressible nature of the fluid at application velocities means that the velocity gradient term is also neglected. The combined Navier-Stoke equation for laminar regime therefore reduces to $$0=-\nabla p+\nabla\cdot((\nabla u+(\nabla u)T)) \text{ and } \partial\rho\partial t+\nabla\cdot(\rho u)=0.$$

This system of equations, coupled with the boundary conditions arising from the geometry of the apparatus, is used to numerically solve for both a pressure and velocity field within the microfluidic circuit. Additionally, within the timescale of our application, the fluid circulates approximately 50 times thorough the circuit. As a result, during any of the 50 circuits or loops, any analytes that pass within 1 µm of the chip are associated onto the surface. This repetitive looping combined with mixing results in an increase in the statistical odds of the analyte samples being encountered by the antibodies. Because of this, the diffusion coefficient term of the convection diffusion equation at the removal site R can be neglected, as the scales in which convection are able to deliver analytes are much faster than diffusion such that it becomes negligible.

There exists a tool to be utilized in quantifying the effects of mass transport through convection and diffusion. The Péclet number (Pe), is a dimensionless number which expresses the ratio of contributions of mass transport via convection and diffusion:

$$Pe=N\text{conv}/N\text{diff}=ci|u|/D\nabla ci=LU/D.$$

As the Reynolds number describes contributions to momentum transport, the Péclet number expresses contributions to mass transport across a characteristic length scale L. The Péclet number is solved for and found to be virtually zero. Because the Péclet number is much less than one, the mass will primarily be transported via diffusion from the fluid onto the chip at the length scale of analyte-antibody interaction. This is incorporated into the greater convention enhanced delivery (CED) flow model concept by a virtual increase in the diffusion coefficient through homogenization before the fluid reaches the sensor via a passive mixing site incorporated into the microfluidic system. By decreasing the characteristic length scale of diffusion even further in these mixing sites, an increased concentration gradient arises which leads to the occurrence of mixing by diffusion, but at greatly reduced timescales. Although the antigens are deposited via diffusion onto the chip, the convective mixing helps to replenish the lower layers by mechanical homogenization and prevents a concentration gradient from developing that would impede sensor saturation timelines. Because of the electrochemical attraction that exists between an antibody and antigen, there exists a range in the fluid flow for which spontaneous capture is likely to occur. As a result, homogenization allows for quicker sample saturation as with each pass the lower layers are refreshed and do not have to act on diffusion timescales to replenish the layers in which capture can occur.

Conjugation Between Analyte and Antibody—the Association Rate

There exists an intrinsic association rate K≡kon/koff that dictates the capture rate of analytes to the fragmented antibody layer. This property is intrinsic to the covalent reaction between the analyte and its receptor antibody. Although the electronic affinity for capture between a single antibody and its target analyte cannot be altered through biochemical techniques, it can be virtually increased through several different geometrical applications. One such application is the increase in the total number of available antibody capture sites. By increasing the capture site density on the sensor, a virtual increase is created in the association rate between antibody and analyte, as spontaneous capture is inherently more likely to spontaneously occur as the number of available binding sites increase. Simultaneously, advances in biochemical laboratory techniques allow for the packing density of single chain fragment variable (scFv) antibodies onto the surface with greater preferential directionality.

The antibody fragments we choose for our sensor and mass amplifiers are designed to have a high affinity for binding to a particular analyte while possessing a mass much greater than the analyte to be more readily detectable by the SAW sensor. Additionally, antibody fragments possess a vectoral affinity and rigidity that works to support the strategy of mass amplification regarding surface acoustic wave sensing modality. By employing mass amplifiers, a three-piece sandwich ELISA is created, consisting of an antibody capture site welded to the sensor, a target antigen captured from the fluid sample, and a mass enhancing particle, such as a gold magnetic nanoparticle or a magnetic bead. Because a single mass amplifier has a mass thousands of times greater than the target antigen, this ELISA binding process allows us to detect target materials that would otherwise be undeletable because of the LOD of the device.

The addition of mass loading to the SAW sensor during shear wave propagation enables a detectable phase shift in the acoustic waveform to be observed because of the attenuation of the surface shear waves in response to the additional mass. This correlates directly to the ratio of analyte surface coverage of the SAW sensor at equilibrium to total available surface sites as explained below. This final solid-state phase shift is registered electronically by a reader mechanism which uses a microprocessor to analyze the data and store or transmit the results to the user be it the physician or the institution.

Given an antibody-antigen reaction that follows an adsorption pattern according to the Langmuir Isotherm, the surface adsorption process is be expressed as:

[Antibody]+[Analyte]⇔[Antibody−Analyte complex], or $[Ab]+[S]\Leftrightarrow[AbS]$ With forward reaction constant kon and reverse reaction constant koff. The adsorption can be described using the differential equation:

$$d\Gamma/dx=D(\partial C/\partial x)$$

where C is concentration; D≡Diffusion Constant (cm2/s), Where Γ≡Surface coverage (molecules/cm2), and the equilibrium constant:

$$K\equiv kon/koff=\Gamma/(\Gamma\ \max-\Gamma)Cb;\ \Gamma\ \text{equilibrium}=\Gamma\ \max\ KCb$$

where Γ max is the total number of available antibody binding sites on the surface of the detector, kon is the antibody association rate, koff is the antibody disassociation rate, Cb is the concentration of the analyte. The kinetics can be related to the rate of diffusion in the solution by $$JD=\text{Rate of diffusion}=D(\Delta C)/L,$$

Where ΔC is the concentration gradient of the suspended particles, L is the diffusion length and the simple Langmuir first-order rate of adsorption (for low coverage) at the surface, JR: JR=kads CS (Γ max−Γ), where kads is the equilibrium constant. When using the SAW Biosensor, the endpoint is typically used i.e. when the system reaches an apparent steady-state (the delta phase value levels off). At steady-state:

$$JD=JR\therefore D(Cb-Cs)L=kadsCs(\Gamma\ \max-\Gamma)$$

solving for the surface concentration at steady state:

$$CS=Cb/(1+kadsL(\Gamma\ \max-\Gamma)/D),\ \text{or}\ CS=Cb/(1+\theta),$$

where θ is known as the Thiele modulus, a dimensionless parameter. For cases where the value of θ>>1, Cs approaches 0, and any antigen contacting the surface will be absorbed onto it, in this case, the rate of surface coverage is determined by the rate of diffusion in solution or:

$$JD=D(Cb-CS)L.$$

For cases where θ<<1; Cs approaches Cb. Therefore, the diffusion in the solution is faster than the adsorption and the kinetics of the process is governed by the rate of adsorption at the surface. In this case:

$$JR=kadsL(\Gamma\ \max-\Gamma)$$

When not in a limiting case, the equation for Cs is solved. Based on literature values, the value of θ is calculated to be 2×10−9; θ<<1. Assuming a Diffusion constant given by the Stokes-Einstein equation gives:

$$D=kbT/6\pi\eta r\cong 5\times 10-7$$

where kb is the Boltzmann constant, and η is the dynamic viscosity. The packing density of the antibodies nanoparticles in the immunoassay assay is estimated at 1010 molecules/cm2. Therefore, the rate of change of the surface coverage can be given by an adsorbing species is given by the simplified equation:

$$d\Gamma/dt=kadsCb(\Gamma\ \max-\Gamma).$$

Since all experiments are performed at approximately the same temperature (temperature-controlled cartridge), assume that kads remains constant. Integrating with initial conditions:

$\Gamma(0)=0; \Gamma(t)=\Gamma,$ the solution becomes:

$\Gamma = \Gamma \max(1-e^{kadscbt})$, or $\Gamma/\Gamma \max = 1 - e^{kadscbt}$.

The time constant which determines the relaxation time for each run, $\tau$, is given as $\tau = 1$ kadscb. The $\Gamma/\Gamma$ max is directly proportional to the corrected, normalized phase change. Therefore, the correlated values:

$\Gamma/\Gamma$ max=delta phase (sample)/delta phase standard (glycerol)=$1-e(-t/\tau)$.

The signal is assumed to reach saturation at the end of $3\tau$, which corresponds to 95% of the delta phase value. This is estimated to be less than 10 minutes. The delta phase values depend on both the concentration of the antigen and the incubation time. The transient is assumed to typically last less than 10 min but is dependent and the antigen antibody combination.

Shear Horizontal SAW CHIP

Elevated troponin levels generally indicate heart damage unless proven otherwise. It's presence in the blood indicates heart failure, and a sudden spike in troponin levels indicates a heart attack. When the heart muscle tissue is damaged, it releases the protein troponin into the blood stream. Typically, when a patient is admitted into an emergency care unit complaining about chest pains, a sample of blood is drawn and sent to the lab for troponin level analysis. If a sample came back above a reference value, additional further tests were administered. The problem with the current system is with the laboratory turnaround time. Currently in the developed world, clinical and laboratory turnaround times in troponin T testing to be about 122 minutes from admittance to diagnostic of a heart attack. This includes drawing the sample, transport to the laboratory, prepping the sample for testing, and the actual tests which themselves take over an hour to complete.

The illustrated rapid biosensor performs a diagnostic test, where instead of a lengthy process during which the heart continues to be damaged during the entirety of the laboratory process, a sample is taken and in 10 minutes doctors would know to start treatment. The sample can be drawn in an ambulance, and the SAW testing occurs during the transport to the hospital. Patients are unloaded from an ambulance with a laboratory diagnosis of their troponin levels to indicate whether immediate treatment for heart failure should be administered. Such an embodiment shows the power of fast, portable biosensing. No longer is the device limited to the regime of preventative medicine or diagnostics, but can also be used as a life saving emergency device.

The main property of a SAW sensor is that it attenuates or shifts the phase of a waveform. There are variables that determine this phase shift, such as the material, lane length, but one dependent variable is mass. Any loading on the waveguide layer, through pressure changes associated with mass, causes a distinct phase shift in a wave that traverses the medium. In fact, many of the commercial telecommunications SAW filter properties are generated by depositing varying layers of thin films to weigh down the waveguide layer to attenuate the signal based on the application needs.

The illustrated SAW sensor has adequate shielding such that it can be used not only in open air, but in fluids without shorting or crosstalk across the liquid medium. A SAW surface, functionalized with an antibody layer, traps any target analytes in a fluid sample. As the antibody sites fill up, the addition of mass onto the SAW results in a detectible phase shift. This leads to some further probing SAW's as a potentially new field of biosensing. Early results, although promising, required concentrations of antigens much higher than of any practical usage. Two problems exist with other attempts to successfully utilize the SAW as a biosensor. Initially, the trials lacked any form of amplification, or the addition of mass to a target analyte such that it can be more readily detected. Even the most precise of SAW sensors have an intrinsic limit of detection, or minimum mass required, that arises from the target frequency used. Too low of a frequency would result in a massive limit of detection and an unusable result. Too high of a frequency causes the vibrations to bleed into the other sensing lanes causing interference, as the walls that separate each channel become invisible to the high energy waveforms. The addition of a mass amplification step resolves the issue of a limit of detection, but requires additional biology in the detection step in the form of mass amplifiers, as well as a complex microfluidic apparatus that can deliver said mass amplifiers without returning any false positives.

Isothermal DNA Detection

Polymerase chain reaction (PCR) is one of the two most commonly performed biochemical laboratory procedures in the modern arsenal of diagnostic medicine. Through the repeated thermal cycling of a DNA strand in question, DNA melting separates the double helix strands and isolates segments of a known codex, and enzymes rapidly replicate the extracted segment. Through this isolation and amplification, millions of copies of a single strand of DNA are created which can easily be more readily counted than just the initial concentration. The application for multiplying DNA strands for counting are for screening for genetic biomarkers. For example, if a patient wanted to be tested to see if they were a genetic carrier of a disease, particularly leukemias and lymphomas, a PCR kit that isolates the DNA segment that is responsible for the cancerous mutations is employed. A sample of blood containing the patient's DNA is tested, and after administering PCR, the resulting sample would either return no strands of the target DNA, or billions of them. The presence of the replicated DNA indicates to a physician that the patient was a carrier of the mutagenic gene. PCR has dramatically altered medicine.

Being a staple of modern DNA detection, there have been several challenges in miniaturizing the process to lower the barrier of needing specialized technically trained labor to test for the presence of a sequence specific DNA segment. The repeated thermal cycling requires heating the sample to 95° C., then lowering it to 55° C. anywhere from 25-30 times. For an optimized, room scale thermocycler, each cycle can be completed in about two minutes, resulting in a little over an hour per test. Additionally, a trained technician must place the resulting sample into a gel electrophoresis machine and allow for the strands to separate and compare it against the target DNA. The fact that the sample preparation occurs separately from the testing poses additional challenges in automating the process while keeping cost of testing down.

One such application is the use of the SAW platform to conduct sequence specific DNA strand detection similarly to PCR by using an orthogonal set of CRISPR associated protein 9, (Cas9 RNA), which is an RNA-guided DNA endonuclease enzyme associated with the CRISPR (Clustered Regularly Interspaced Short Palindromic Repeats).

Cas9 RNA proteins bind a gene of interest. The first nucleotide segment is bound to the sensor surface, and the corresponding last nucleotide segment is bound to a mass amplifier. Much like how a target protein acts as the linker between two antibodies to induce a mass loading on the sensor, the two engineered Cas9 proteins are capable of inducing mass loading on the sensor in the presence of a target strand of DNA.

Unlike testing for a virus, a concentration is not needed, only a binary yes/no to indicate whether the patient carries the target gene of interest. Being able to rapidly deploy a test to screen for oncogenic amplifiers allows for cancer screening tests to become as common as taking one's blood pressure. The ability to rapidly screen for known DNA disease indicators makes modern cancer treatment orders of magnitude more effective, as almost every study shows that improving early detection reduces fatality rates and the burden of cancer. The allotted time allows for precancerous growths and early cancers at almost any part of the body to be removed via medical intervention.

The ability for the SAW platform to readily change between an analyte concentration reader and a specific DNA strand detector shows the adaptability of the platform. Much like how the last twenty years has seen a unilateral adoption of ELISA and PCR at the academic and industrial level, the SAW platform is versatile enough that it can be adapted to a specific need and react accordingly as the need arises. Thus, what is realized by the illustrated embodiments is an entirely new class of analytical chemistry tools.

Additionally, when designing the cartridge, the cost needed to be minimized while still containing all the necessary sensors and drivers that a SAW test necessitates. The cartridge needs to include an electrically driven syringe pump, radio frequency lines for communicating with the SAW sensor, temperature sensors, and an optical channel for fluidic transport inspection. All of these peripherals were integrated into a flexible circuit board that is designed to sit underneath the cartridge and link all of the electronic components with the reader. The cost of a single cartridge, including the cost of the injection molding and all electronics, is stringently kept under two US dollars (2018 dollars), to keep in line with our promise for cheap, accessible medical diagnostics.

Filtration and Separation

In addition to being a mass detector, the SAW also registers changes in viscosity of a fluid as a phase shift. Because the device is unable to differentiate between phase shift associated to mass conjugation and viscosity increases, and to additionally reduce any interference in the conjugation of the analyte to the sensor, the microfluidic circuit must include a way to filter the whole blood cells found in a traditional complex assay from the target analyte and the plasma serum that will carry it to the detector. While the viscosity of whole blood serum is high, the viscosity of plasma is much closer to that of water, for which the chip does not see the effects of viscosity due to the 325 MHz RF signal.

To be able to use a membrane-based blood separation filter, the fluidic positive pressure is much greater than can be exerted by a piezo pump. As a result, the filter creates the need to utilize a syringe pump mechanism for fluid transfer which his capable of generating much greater pressures.

The double membrane filtration mechanism allows for a greater surface area of filtration membrane without resulting in an increase in diameter of the fluidic pathway, resulting in a reduced propensity for the filter to clog and create a backpressure that halts or retards fluid motion. The smallest filtration pores should not be too small so as to impede the passage of magnetic beads, or even to interfere with the surface chemistry of attaching the beads to the target analyte through any interactions.

Magnetic Conjugation

To overcome the inherent challenges associated with diffusion, the use of magnetic nanoparticles allows for site directed manipulation of the suspended half-immunoassay magnetic nanoparticles. By utilizing magnetism, the diffusion timescale, which when left to its own accord could take hours to enable a suspended particle to diffuse to the surface, instead this application uses magnetic forces to instantaneously draw the magnetic nanoparticle to the sensor surface.

The challenge associated with using an electromagnet is the drawing of power from the device and the local increase in temperature, By using a rare earth magnet, such as a NdFeB magnet, allows for magnetic field strengths of 0.5 Tesla, for example, at a large magnetic field to size ratio. To prevent accumulation of the magnetic nanobeads along the magnetic field lines, a magnet surface area greater than the SAW is chosen to allow for a uniform gradient of magnetic field strength at the surface of the SAW sensor footprint.

In addition, a magnetic field allows for a greater degree of rotation of a magnetic nanoparticle, as they rotate to align with the magnetic field lines. This rotation results in an increased propensity to conjugate as the rotation of the nanoparticles increases the chance of an analyte and sensor antibody to find each other in the right orientation and make an immunoassay binding.

When solving for the force acting on a magnetic nanoparticle, the equation for a square permanent magnet based on the Br Remanence of the magnet (residual magnetism), L length of the block, W width of the block, and D thickness of the block, and Z the distance between the magnetic nanoparticle and the pole face of the magnet is as follows:

$$B = \frac{B_r}{\pi} \left[ \tan^{-1}\left(\frac{LW}{2z\sqrt{4z^2 + L^2 + W^2}}\right) - \tan^{-1}\left(\frac{LW}{2(D+z)\sqrt{4(D+z)^2 + L^2 + W^2}}\right) \right]$$

From this equation, we can quantify the dimensions necessary for a magnet to be able to pull magnetic nanoparticles onto the surface at a particular distance, as well as the distance required when removing the magnet from the sensing chamber so that the magnetic field strength falls off to the remnant background magnetic field strength. By using simple Taylor expansion, the first term in the expansion is proportional to $1/r^2$, which indicates a rapid decay in field strength with distance. Given the thickness of the SAW sensor as the closest distance the magnet can approach the fluid, and a magnetic strength of, for example, 0.5 Tesla to attract magnetic nanoparticles, by displacing the magnet roughly 1 cm away from the SAW surface, the magnetic field strength decays to $1/100$ of its maximum field strength, resulting in the suspended magnetic beads field of approximately 50 Gauss, which is below the minimum threshold for the magnet to act upon the nanoparticle.

A SAW System Overview Technical

General and overall design considerations having now been set forth above as first illustrated in the incorporated applications, U.S. Provisional Application Ser. No. 62/597, 202, and U.S. patent application Ser. No. 15/597,090, to which priority is claimed, turn now to a fully engineered SAW embodiment. Details disclosed in the incorporated applications will not be repeated, but improvements and concepts included in the present embodiment will be described below.

Figure 2:
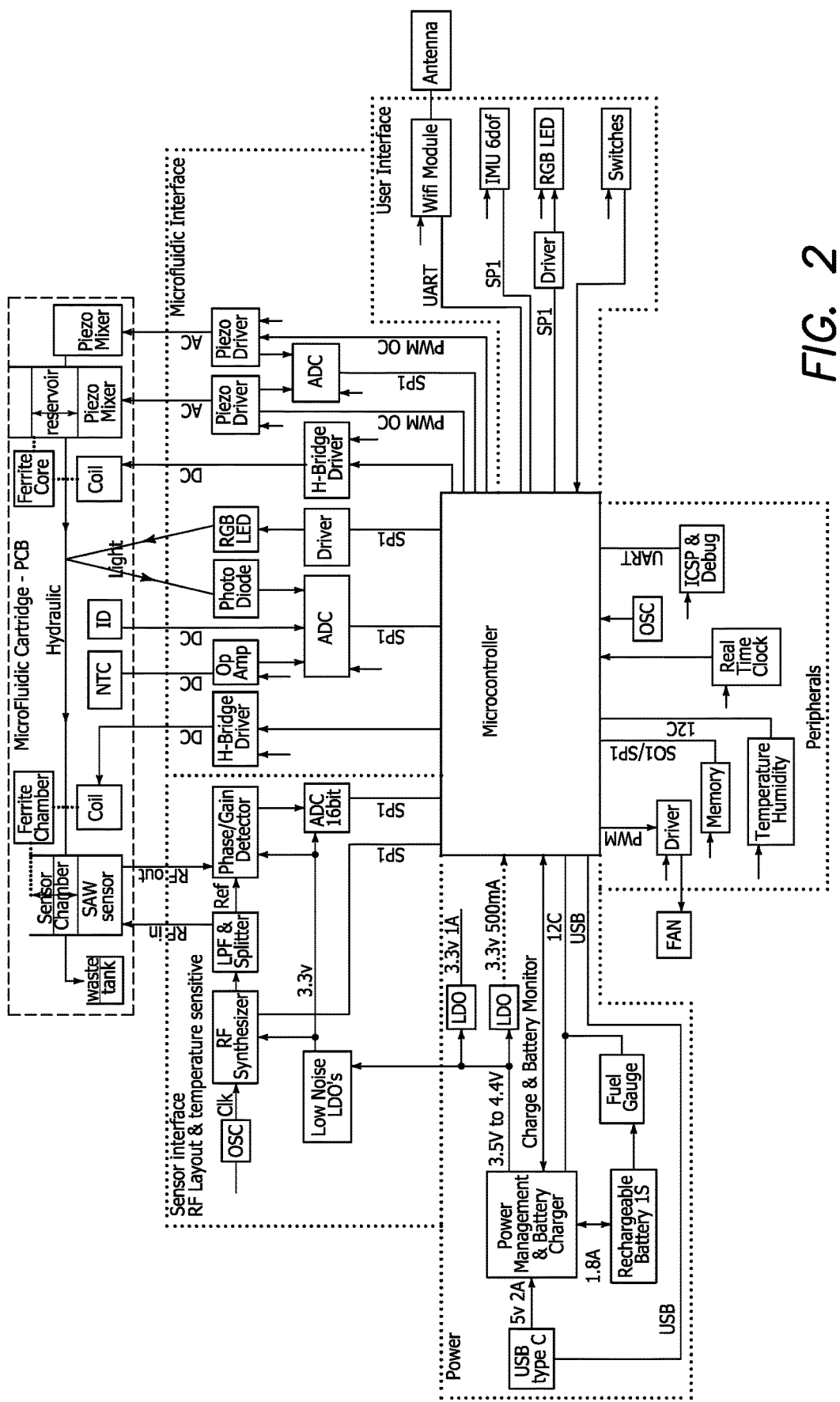
FIG. 2 is a block diagram of the electronic components controlling or coupled to the microfluidic cartridge.

FIG. 1 is a high-level block diagram of the illustrated SAW system, generally denoted by reference numeral 10. Details of the circuitry and modules of FIG. 1 are shown in FIG. 2, but will not be further discussed here, and can be found described in detail in the incorporated applications.

Figure 3:
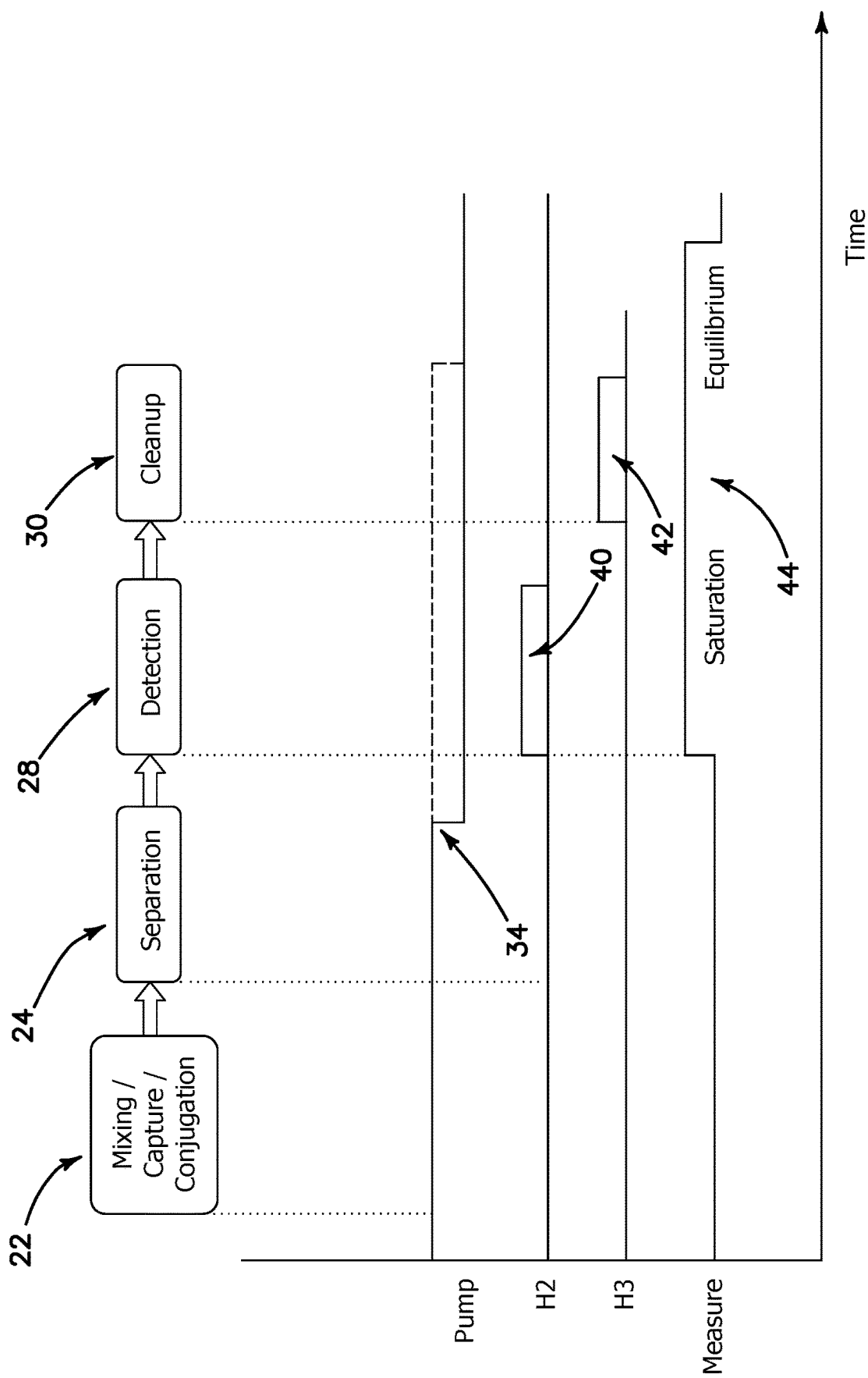
FIG. 3 is a timing diagram of the microfluidic sample delivery sequence used in the cartridge.

FIG. 3 is a timing diagram showing the necessary steps and order required for a measurement to be taken by the SAW microfluidic cartridge. After the sample is injected, the mixing/capture/conjugation step 22 occurs in the first reservoir of the device. The sample is pumped during time period 34 through the microfluidic circuit in the separation step 24, where the fluid is filtered and the whole blood is separated from the target analyte. The fluid is transferred to the sensing chamber where the detection step 28 and clean up step 30 occur in sequence to allow for the analyte to conjugate to the SAW, allow for nonspecifically bound amplifiers to be removed, and to allow for a measurement to be taken.

Figure 4:
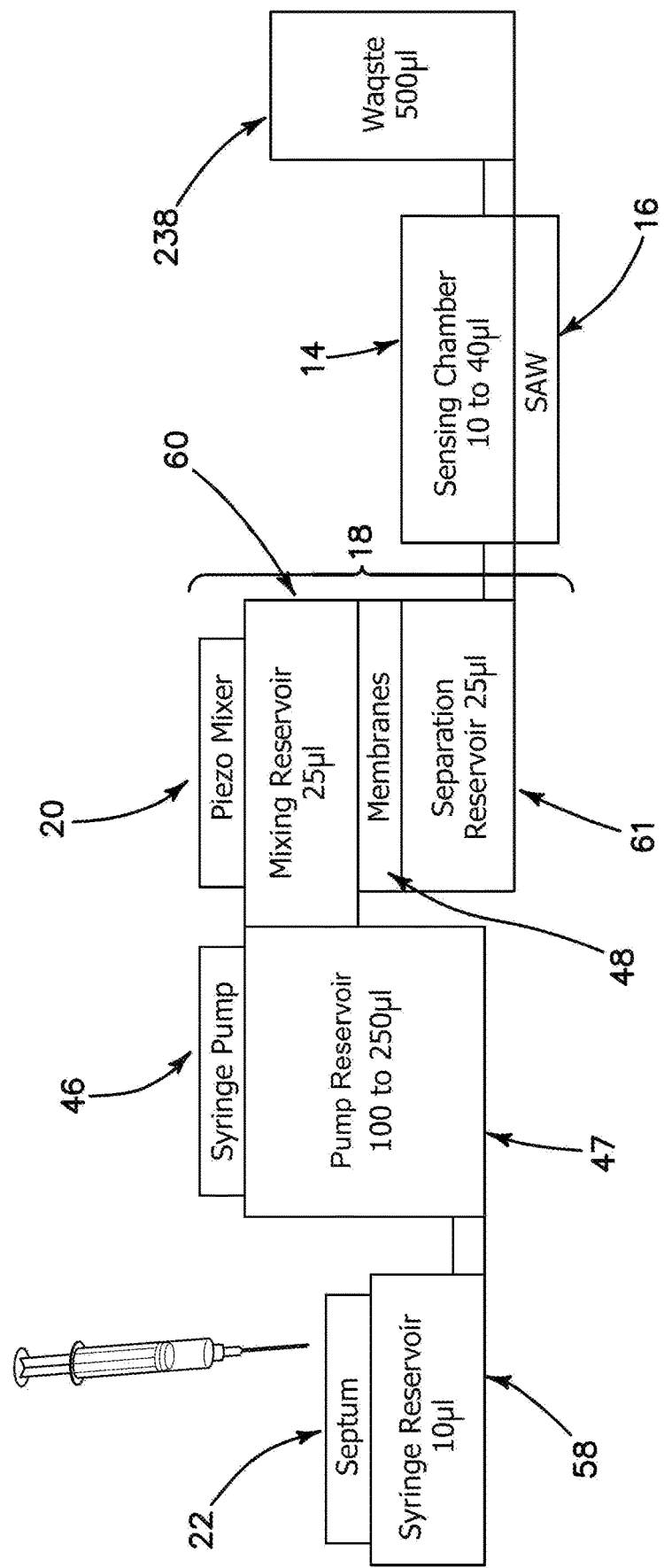
FIG. 4 is a block diagram representation of the microfluidic circuit and its components of the cartridge.

FIG. 4 is a block diagram of the cartridge embodiments. A sample is introduced through the septum 22 to the syringe reservoir 58. The fluid is transferred to the pump reservoir 47, where a syringe pump 46 drives the fluid to the mixing reservoir 60, where a piezo mixer 20 homogenizes the fluid. The positive pressure from the syringe pump drives the blood sample through a membrane 48, which separates the plasma and analyte which passes to the separation reservoir 61, leaving behind the whole blood cells in the mixing reservoir 60. The analyte and filtered plasma are deposited into the sensing chamber 14, which contains the SAW 16, and to conjugate to the surface (See FIG. 11). After the conjugation has occurred, the remaining fluid is transferred to the waste reservoir 238.

Figure 5:
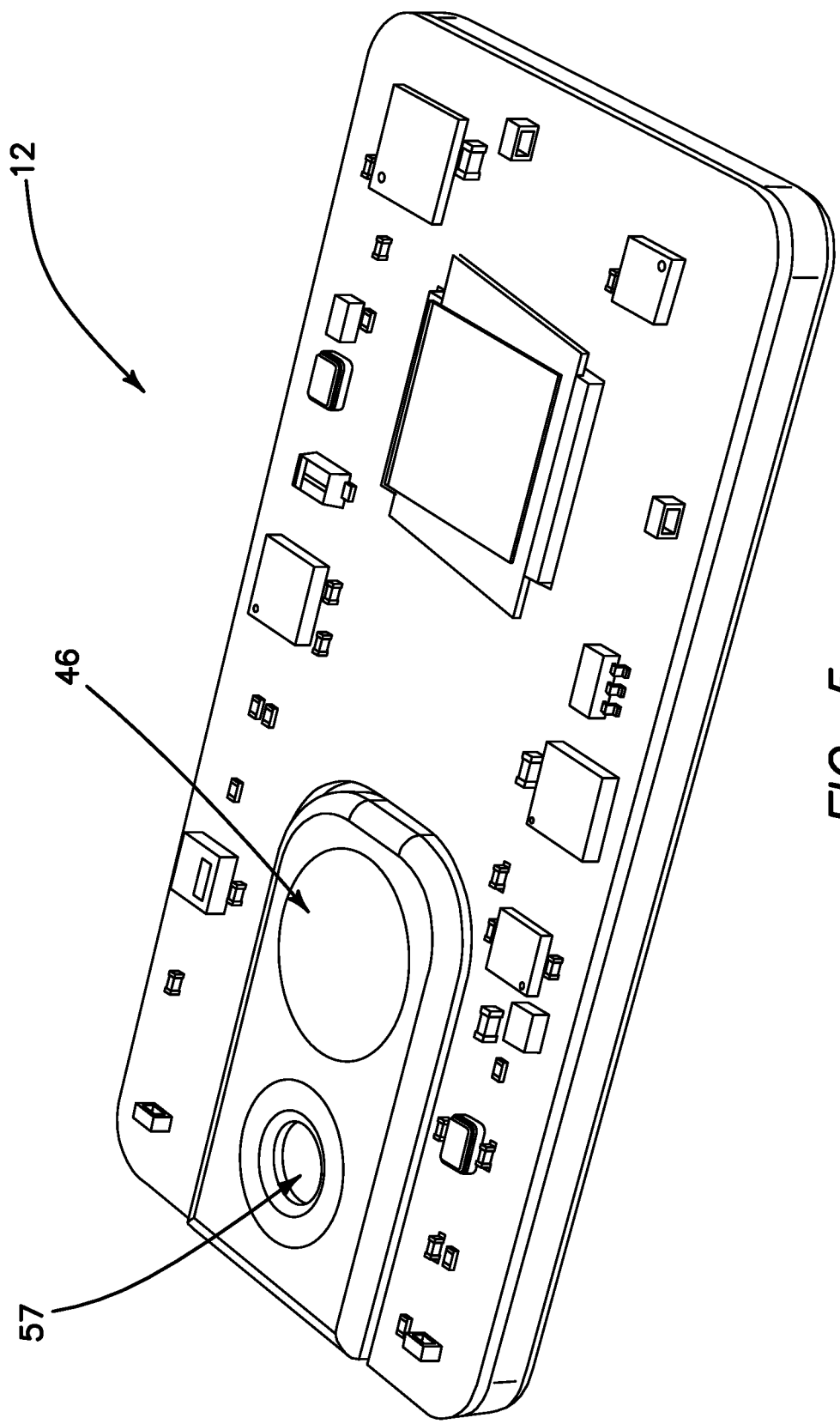
FIG. 5 is a perspective view of a standalone cartridge according to one embodiment of the invention to represent the operation of the delivery-sequencing step.

FIG. 5 is a perspective view of the disposable cartridge 12. Visible from the outside is the septum 57 where sample is injected, the syringe pump 46 head, and the SAW sensor 16.

Figure 6:
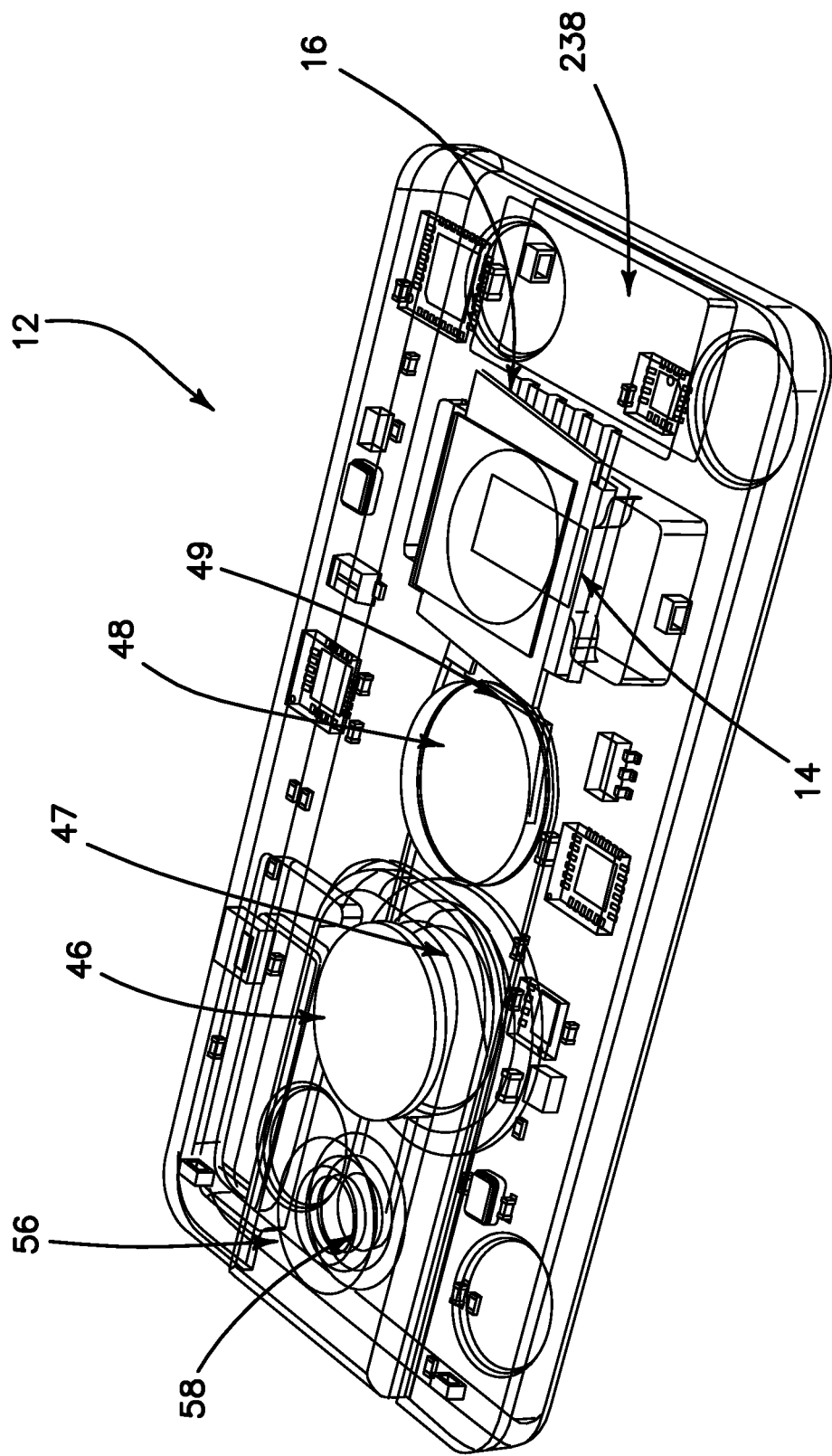
FIG. 6 is an isometric view of the cartridge showing the internal components.

FIG. 6 is an isometric of the disposable cartridge 12. The septum 57 of FIG. 5 is attached above the syringe reservoir 58, which comprises the sample input port 56. The fluid is transferred to the piston reservoir 47, where a piston pump 46 is compressed and forces the fluid through the microfluidic circuit. The fluid flows to a separation reservoir 49 from which the fluid flows through a filter membrane 48 that separates the whole blood from the sample, only allowing analyte and plasma to proceed. The fluid then flows to the sensing chamber 14, where it contacts the SAW sensor 16. Finally, the fluid flows from the sensing chamber to a waste reservoir 238.

Figure 7:
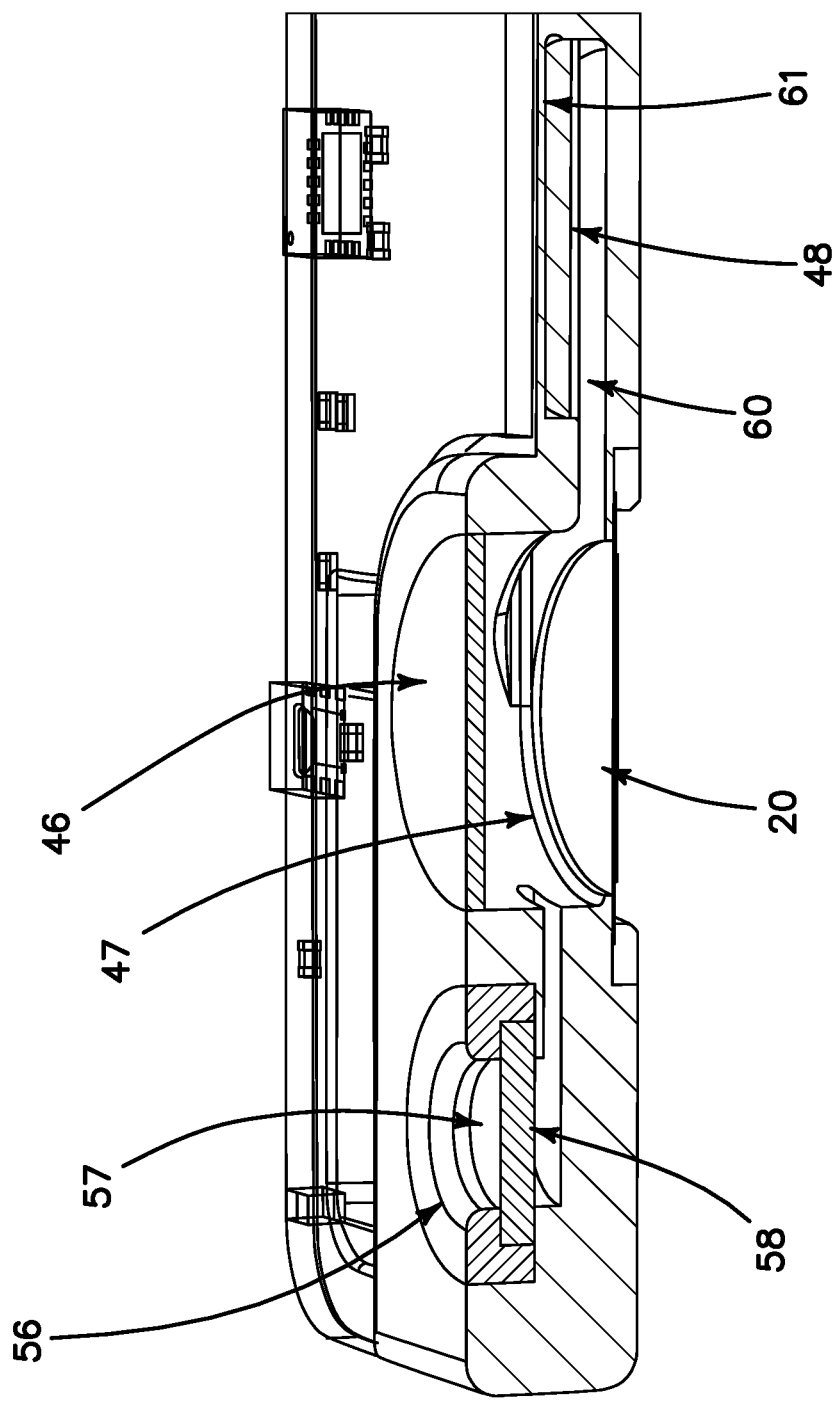
FIG. 7 is a crossectional isometric view of the cartridge showing the sample injection port, piston pump, and separation chamber.

FIG. 7 is a crossectional isometric view of the sample input port 56 and syringe pump reservoir 47. Illustrated is the mechanism by which the septum 57 is attached to the syringe reservoir 58 and the fluid pathway that the sample takes to reach the pump reservoir 47. A piston pump 46 compresses the fluid in the reservoir 47 and creates the necessary positive pressure in the fluid to drive the sample into mixing reservoir 60 and through a filtration membrane 48 into separation reservoir 61 to remove the blood cells from the sample and reduce any associated viscous effects they might have on the measurement taken by the SAW.

Figure 8:
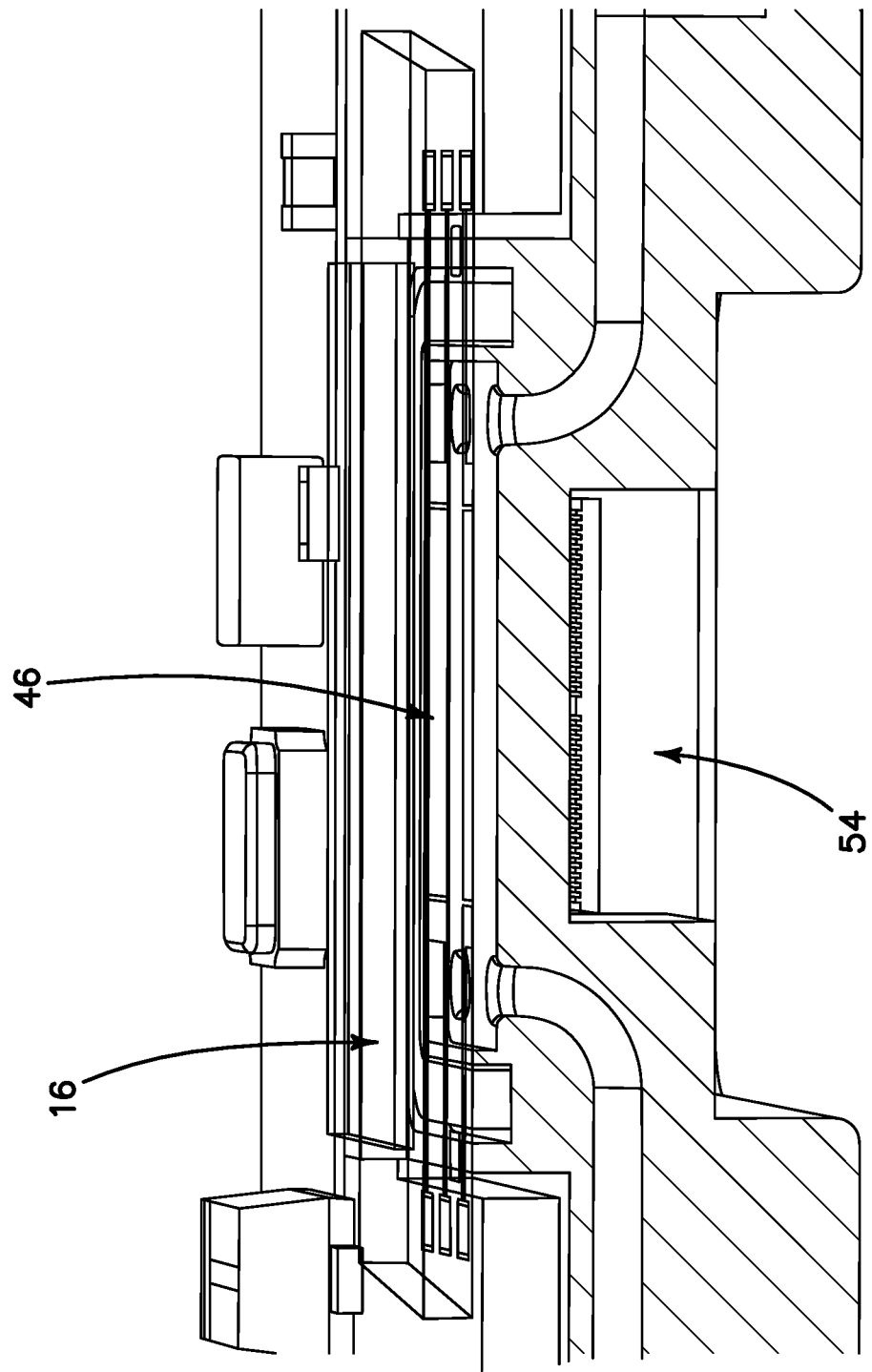
FIG. 8 is a detailed view of the cartridge showing the sensing chamber.

FIG. 8 shows a detailed view of the sensing chamber 14. The fluid enters from the filtration chamber or separation reservoir 61 to the sensing chamber 14 where the analyte is brought in contact with the SAW sensor 16. Orthogonal to the SAW sensor 16 underneath is an electromagnet 54 that is used to remove any nonspecifically bound magnetic nanoparticles from the surface of the SAW 16 to reduce the propensity of the device to make false positive measurements.

Figure 9:
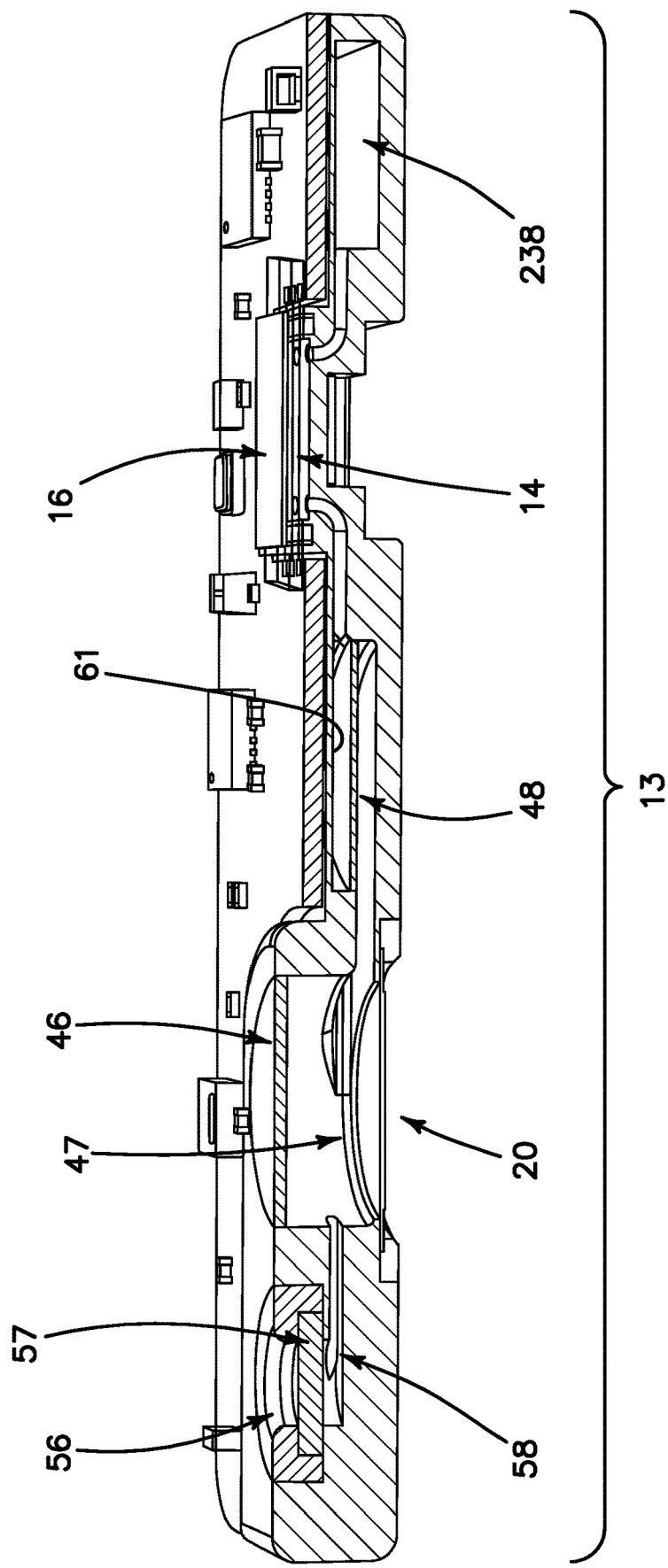
FIG. 9 is an isometric cross section of the microfluidic cartridge and the microfluidic circuit elements.

FIG. 9 shows an isometric cross section of the entire microfluidic circuit 13. FIG. 9 shows how the sample input port 56, piston reservoir 47, separation chamber 61, sensing chamber 14, and waste reservoir 238 are connected to one another.

Figure 10:
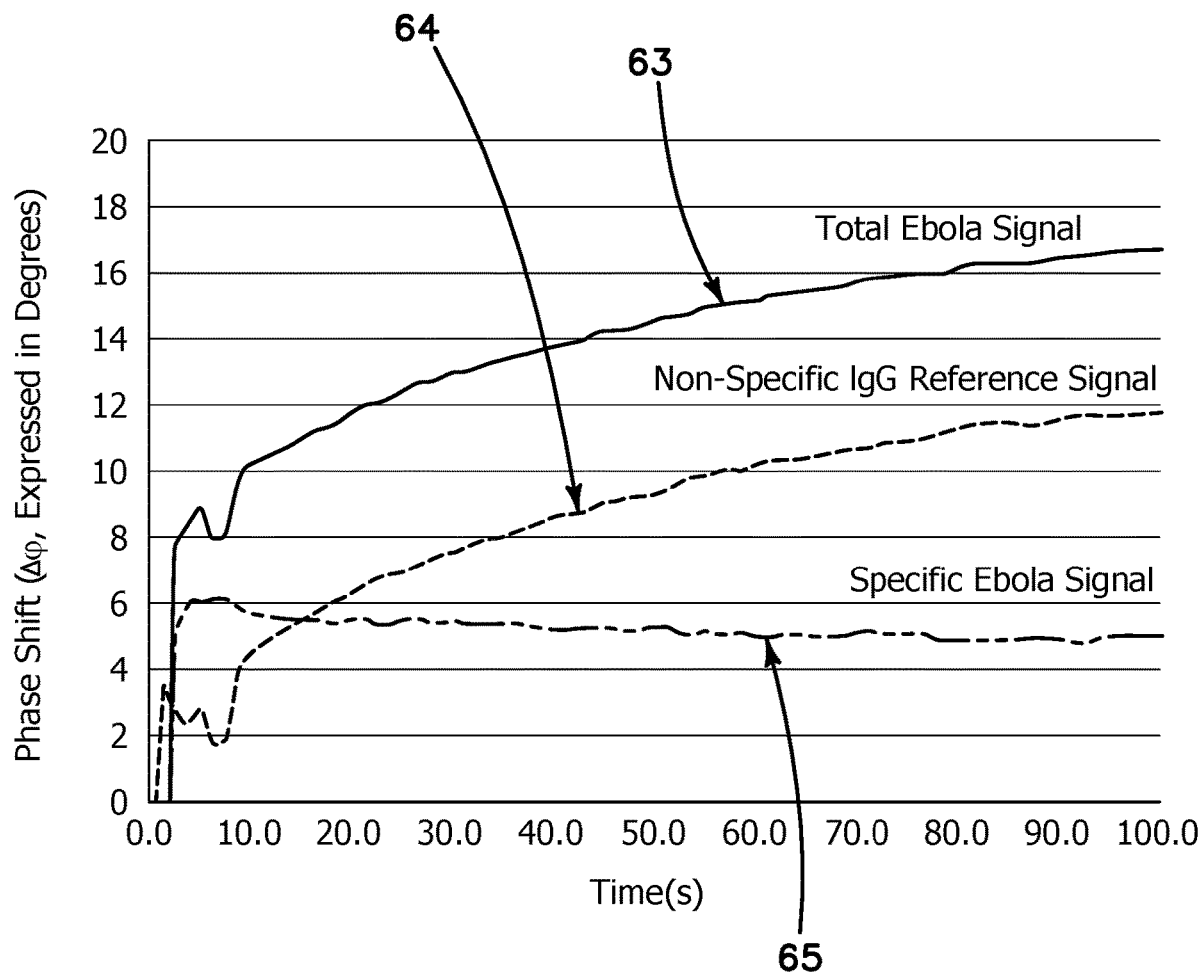
FIG. 10 is a graph of the measured phase shift detected by the SAW sensor as a function of time for a pathogen such as Ebola virus.

FIG. 10 is a graph of the phase shifted output of the SAW sensor 16 and a calculated phase shift $\Delta\phi$ in degrees as a function of acquisition time of a SAW sensor reading. The graph shows data from Ebola collected by the active channel 63 and reference lane 64 for test viral antigen with a concentration of 1,000,000 PFU/mL. The Specific Ebola signal 65 (calculated by subtracting the non-specific IgG signal from the Total Ebola signal) is also shown. Sample acquisition occurs at time 0, and several seconds are required for the signal to stabilize. (Sensors 2015, 15, 8605-8614; doi:10.3390/s150408605, Rapid Detection of Ebola Virus with a Reagent-Free, Point-of-Care Biosensor, Baca et all.)

Figure 11:
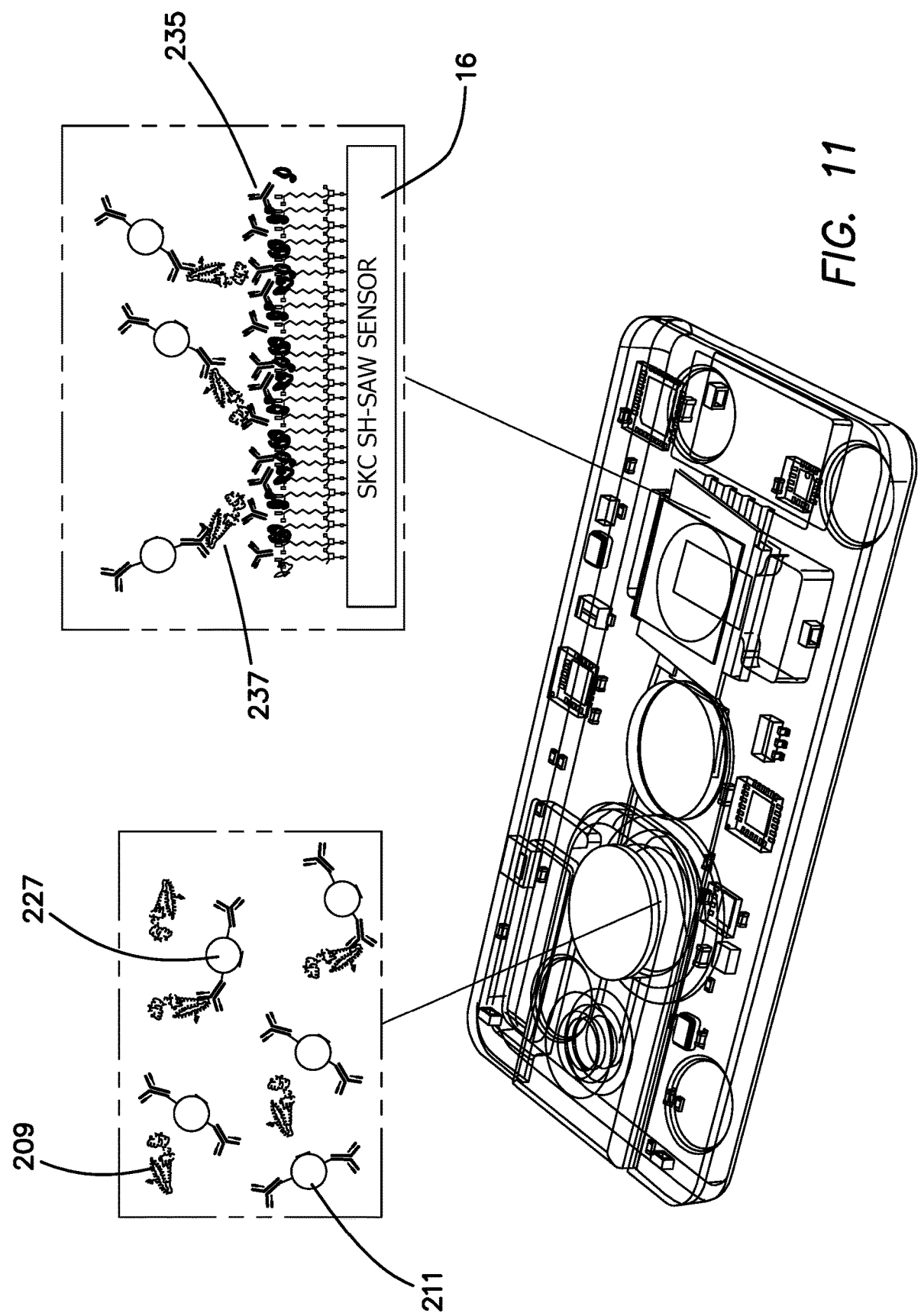
FIG. 11 illustrates an embodiment where a pair of antibodies having unique binding epitopes are used to create a sandwich ELISA style immunoassay.

FIG. 11 is an illustrated embodiment of the two main biochemical interactions that occur in the cartridge 12. In the mixing chamber 60, functionalized magnetic particles 211 are combined with target analyte 209 and homogenized such that the chance of forming an analyte-magnetic bead half sandwich 227 is vastly increased. Once conjugated, the sample flows to the saw sensor 16, which is functionalized with functionalized antibodies 235 on its surface. The analyte-magnetic bead half sandwich is brought in contact with the SAW sensor due to the presence of a magnetic field which draws them to the surface, where they form an immunoassay sandwich 237 consisting of the SAW sensor 16, one capture antibody, the analyte in question, an orthogonal capture antibody, and a magnetic mass enhancing nanoparticle.

Figure 12:
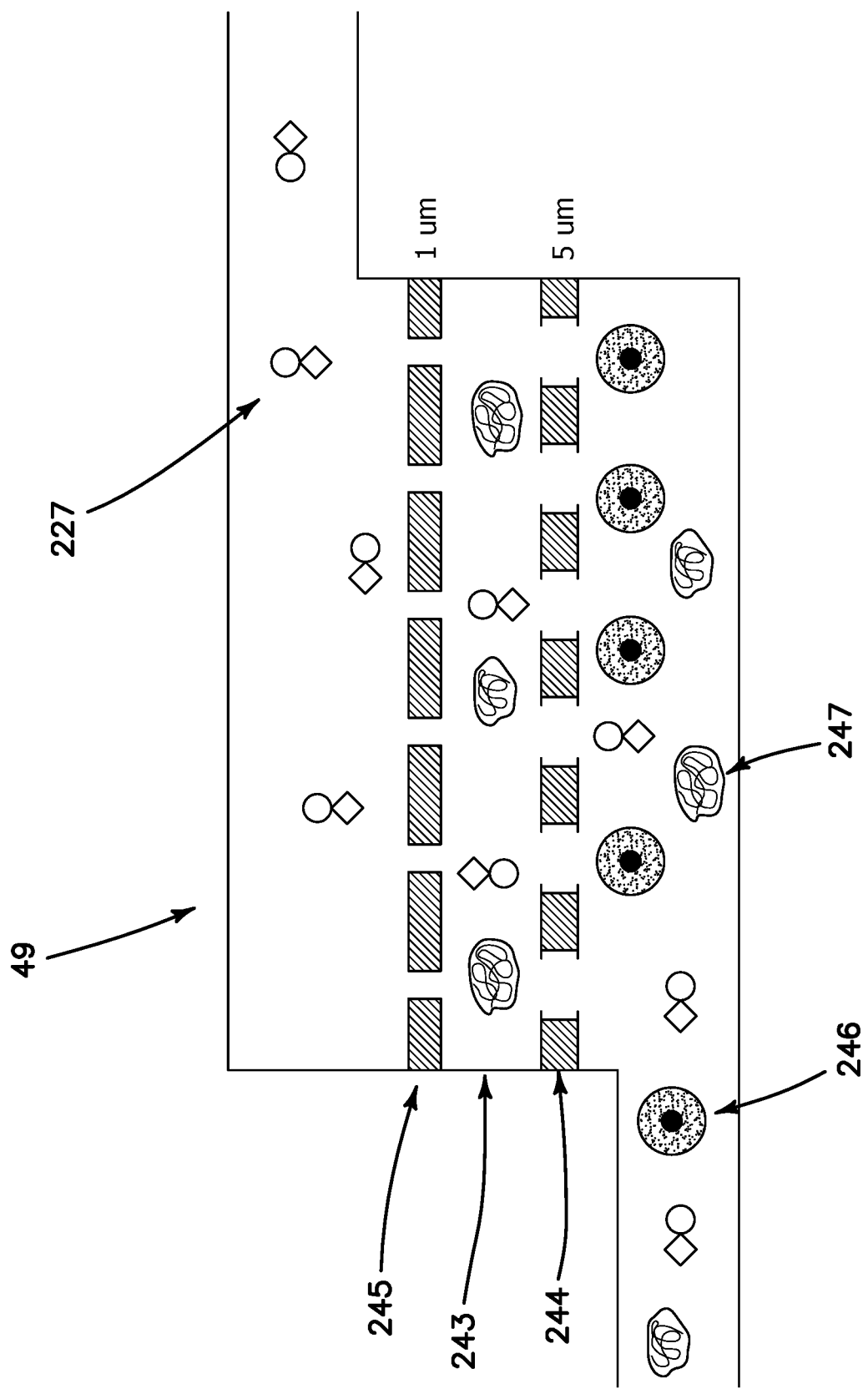
FIG. 12 is a diagrammatic illustration of the filtration chamber and its associated filtration membranes.

FIG. 12 is an illustration of the double membrane filter 243 in the filtration chamber 47. The sample containing whole red blood cells 246, whole white blood cells 247, and analyte-magnetic bead half immunoassay 227 flow into the chamber, where two membranes of varying thickness, one with larger pore size 244 and one with more refined pore size 245 filter out the whole cells 246 and white cells 247 from the fluid while allowing the analyte-magnetic bead half sandwiches 227 to pass through.

Figure 13:
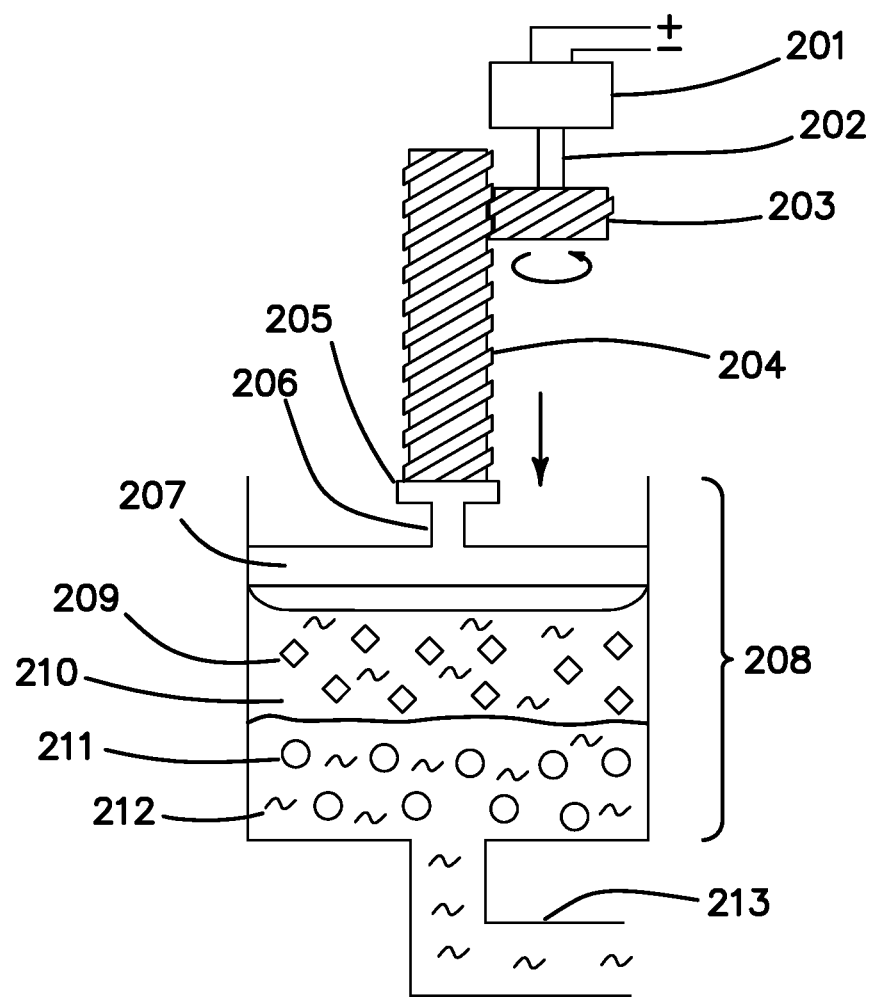
FIG. 13 is an orthographic cross section of the syringe with a pump chamber of the microfluidic circuit.
Figure 14:
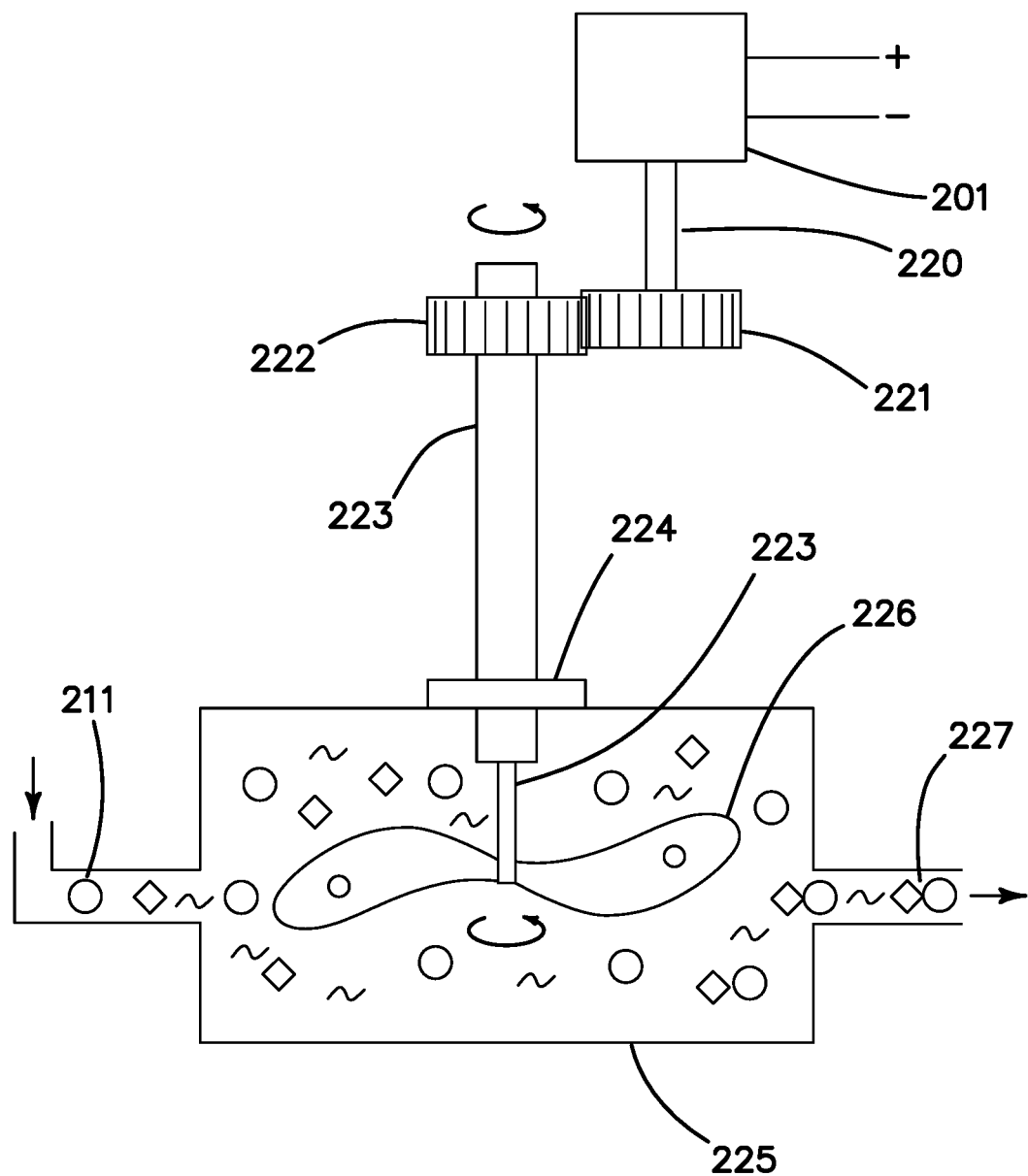
FIG. 14 is an orthographic cross section of the mechanism driving the mixing chamber of the microfluidic circuit.

FIG. 13 is an orthographic cross section detail of the syringe pump chamber 208 incorporated into the cartridge assembly 12. A motor 201 drives a gear 203 via a drive shaft 202 that drives a worm gear 204 attached to the syringe plunger head 207 which is coupled via a coupler 205. As the plunger is driven down via the worm screw motion, the blood 210 sample containing the target analyte 209, as well as the buffer 212 and the magnetic beads 211 are driven from the syringe pump chamber through a microfluidic exit 213 to the next chamber. The syringe pump mechanism generates the necessary positive pressure to drive the fluid through the microfluidic circuit and to the SAW FIG. 14 is an orthographic cross section of the mixing chamber 225 incorporated into the cartridge assembly 12. A motor 201 drives a gear 221 via a drive shaft 220 that drives a mixing gear 222 which drives a mixing shaft 223. The shaft passes through a shaft seal 224 and drives a mixing blade 226 that mixes the incoming analyte 209 and magnetic beads Yeh and forms an analyte-magnetic bead conjugate 227. The mixing chamber allows for the first half of the immunoassay sandwich (Magnetic nanoparticle—analyte) to be formed.

Figure 15:
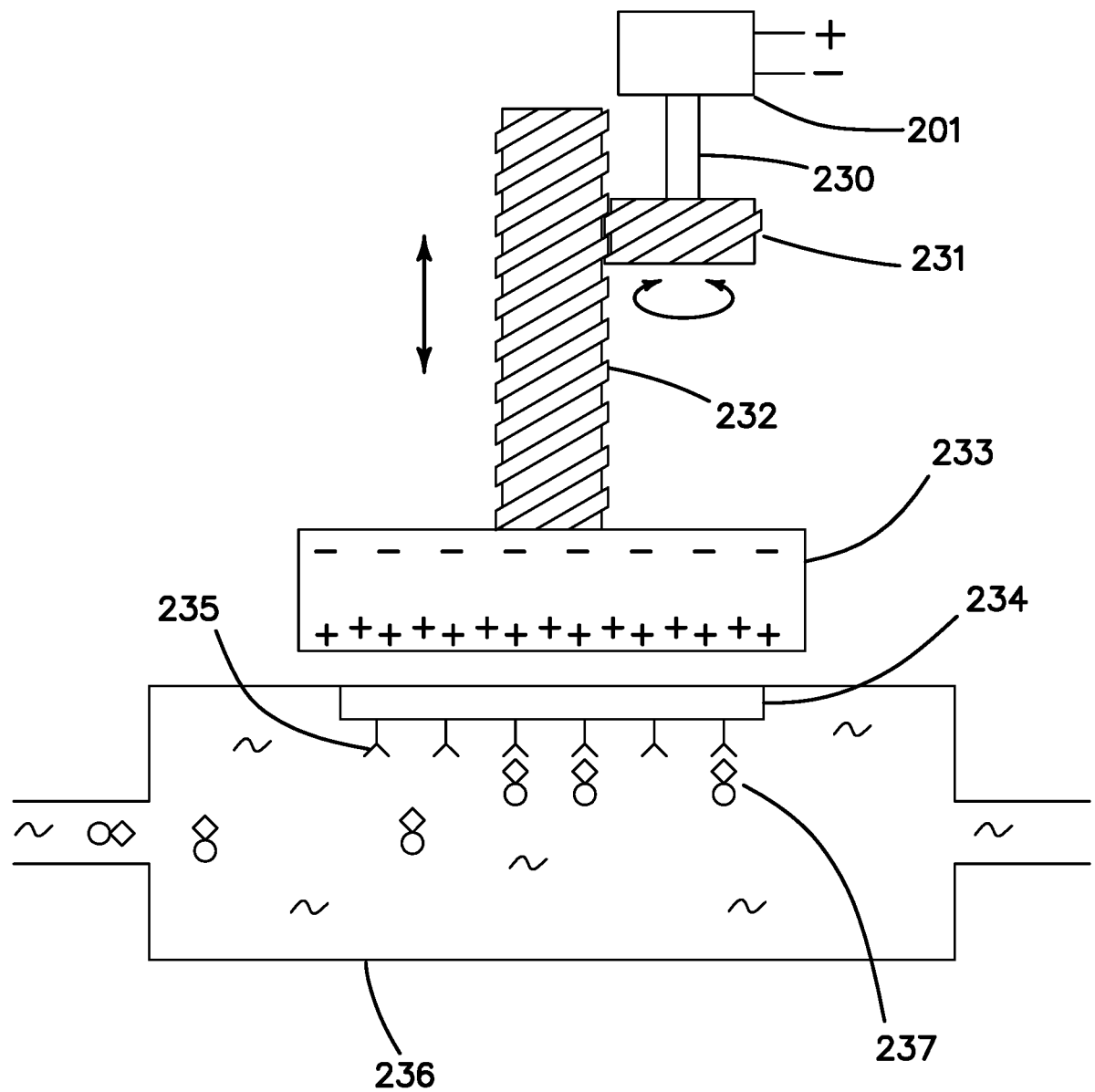
FIG. 15 is a diagrammatic orthographic cross section of a driving mechanism of the permanent magnet located above the sensing chamber of the microfluidic circuit.

FIG. 15. Is an illustration of the sensing chamber 236 incorporated into the cartridge assembly 12. A motor 201 drives a gear 231 via a drive shaft 230 that drives a worm gear 232 attached to the permanent magnet 233 that allows the magnet to travel freely up and down. The magnet approaches the SAW sensor 234, which pulls analyte—magnetic bead conjugates 237 onto the surface of the SAW 234 where they bind to the functionalized antibodies 235 on the surface that allow for a differential phase measurement to be taken.

Figure 16:
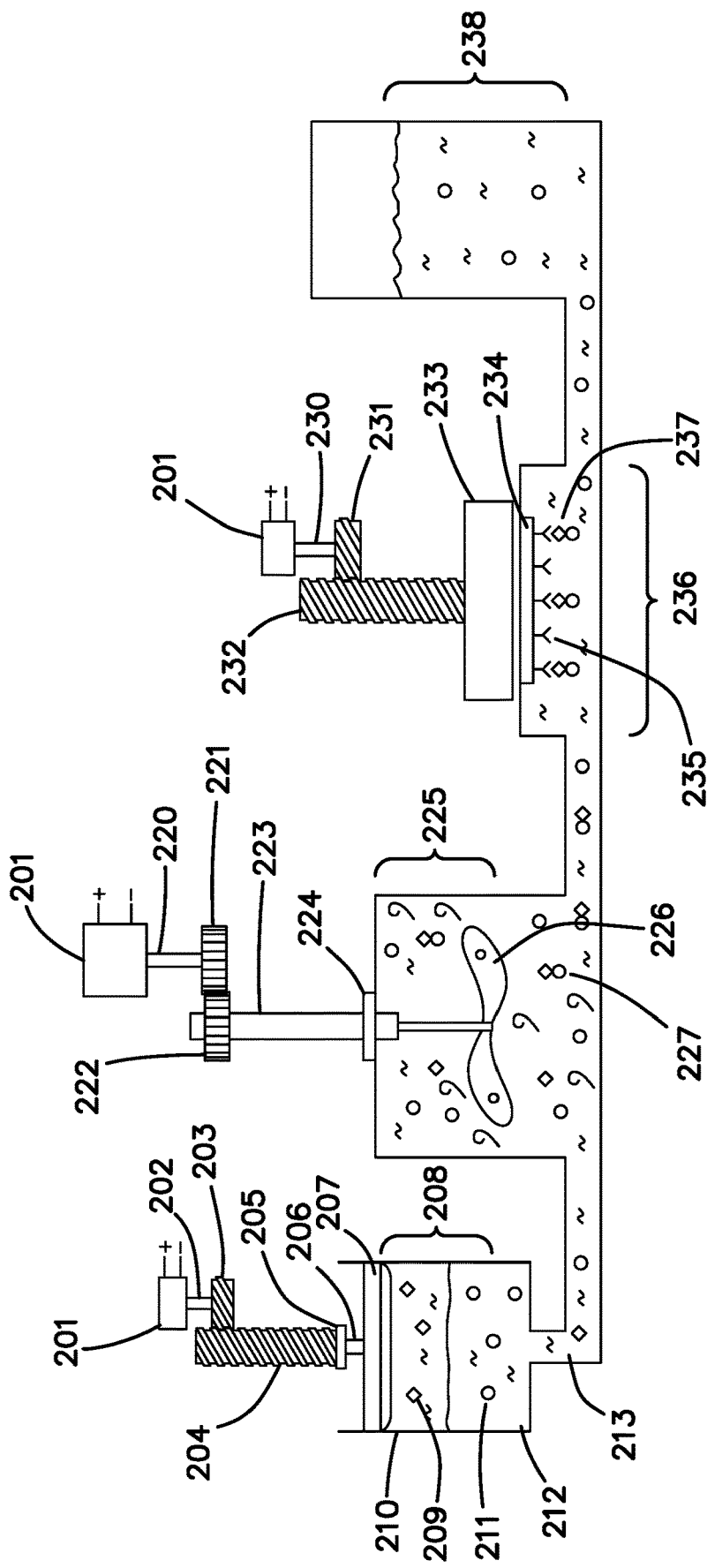
FIG. 16 is diagrammatic illustration of the preferred embodiment of the microfluidic circuit whereby the function of mixing, conjugation, separation, detection, and clean up are illustrated.

FIG. 16 is an orthographic cross section of the microfluidic circuit 12. A motor 201 drives three microfluidic components, the syringe pump 208, the mixer 225 and the sensor magnet 233. A sample 210 is introduced at the syringe pump and is mixed with a buffer 212, where it is transferred through the circuit 213 to the mixing chamber where a mixing blade 226 allows for the analyte 209 and the magnetic beads 211 to conjugate and form a half immunoassay sandwich 227. The half sandwich is sent to the sensing chamber, where functionalized antibodies 235 on the surface of the saw 234 capture the half sandwich and form an immunoassay sandwich 237. The magnet 233 is raised and lowered to increase or decrease the rate of diffusion and conjugation rate. After that the fluid is transferred to a waste reservoir 238.

Figure 17A:
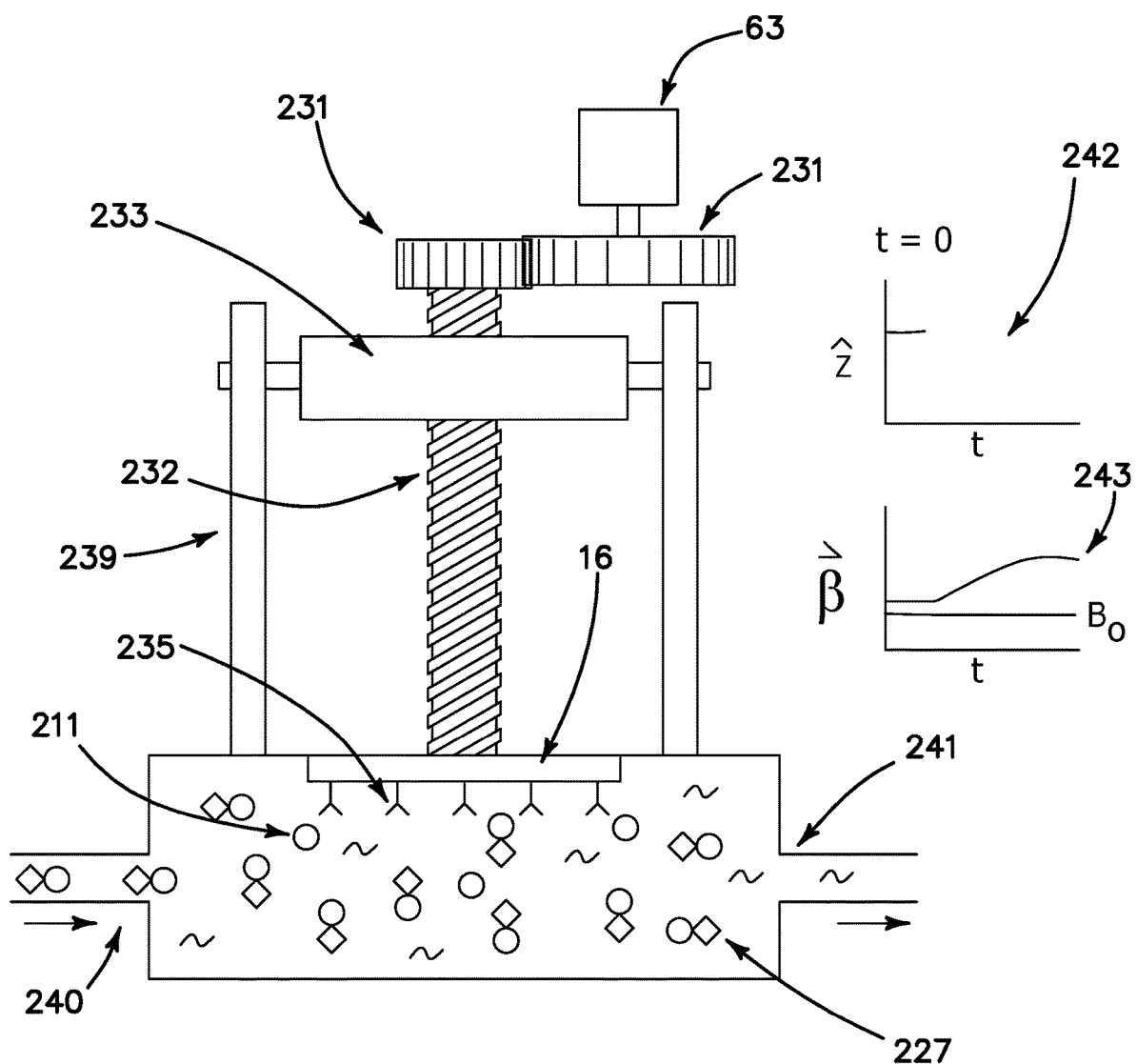
FIGS. 17a-17c illustrate the embodiment of employing a permanent magnet to affect the magnetic nanoparticles in the sensing chamber.

FIG. 17a illustrates the embodiments of the sensing chamber with the permanent magnet 233 raised. Fluid containing both analyte-magnetic bead conjugates 227 and unbound magnetic beads 211 flow into the sensing chamber. After the chamber is full, the fluid flow halts. During the conjugation process at time t=0, the separation distance of the magnet 242 from the fluid is great enough that the magnetic particles do not feel the presence of the magnetic field 243.

Figure 17B:
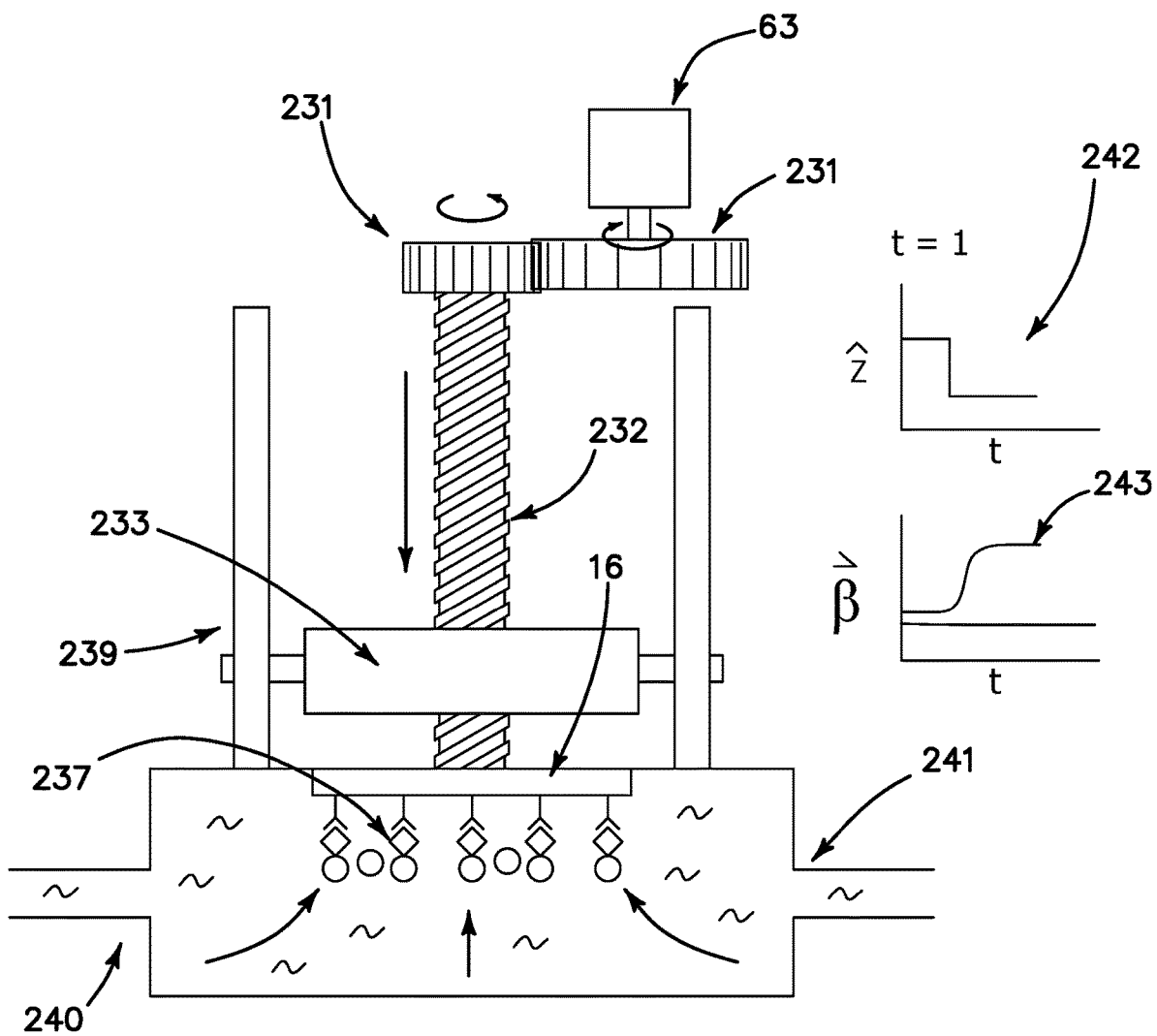

FIG. 17b illustrates the embodiment of the sensing chamber with the permanent magnet 233 lowered over the SAW 16. A motor 63 drives a gear set 231 that spins the worm gear 232 and drives the permanent magnet 233 closer to the sensor surface. The magnet 233 is attached by guiding rails 239 that prevent the magnet from freely rotating, but allow for unimpeded motion in the z direction indicated by the arrow in FIG. 17b. As the magnet is brought lower as depicted by the line 242 in the upper insert graph of FIG. 17b, the magnetic field strength 243 increases on the fluid volume, driving the magnetic beads to the SAW surface, where they can conjugate to the functionalized antibodies on the surface, creating an immunoassay sandwich 237 that the sensor can detect.

Figure 17C:
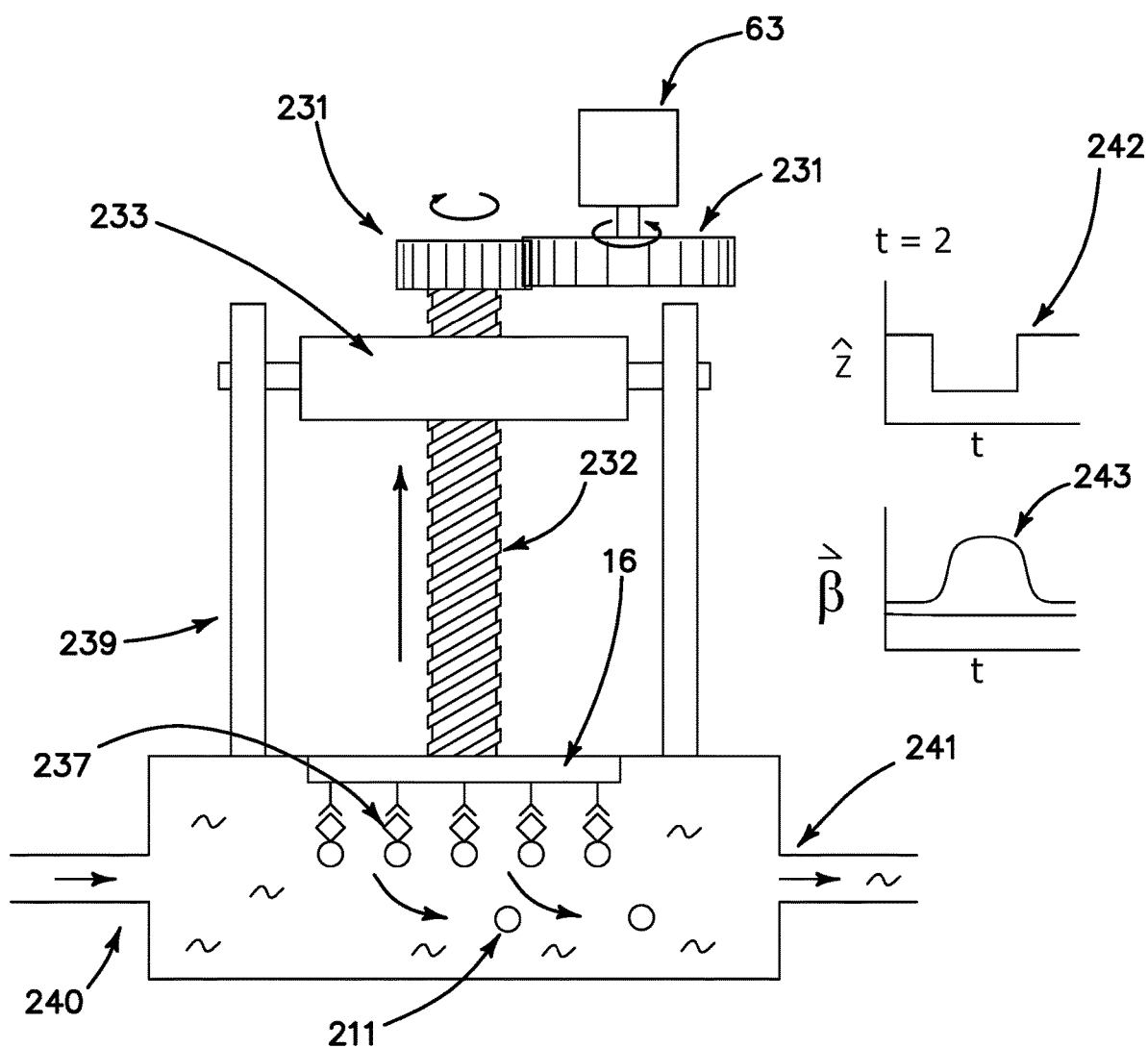

FIG. 17c illustrates the embodiment of the sensing chamber with the permanent magnet 233 returned to its position of minimum field strength. Once the magnet is raised, any nonspecifically bound magnetic beads 241 are no longer magnetically attached to the surface, while the immunoassays are electrochemically bound to the sensor surface. As the fluid is pushed out of the sensing chamber, any nonspecifically bound magnetic particles are removed from the sensor surface, and the process is repeated as new fluid is introduced at the sample input port 240. This process is repeated 10 times.

Using this cartridge and methodology it has been demonstrated that detection in human cardiac troponin ternary complex of subunit I using a SAW sensor and nanoparticle-based immunoassay with 10-nm gold nanoparticles is able to return clinically-relevant results in 10 minutes, which is approximately 5 times faster than laboratory techniques. This will enable fast administration of life-saving treatments.

The illustrated cartridge and methodologies have demonstrated that rapid multiplexed immunoassay for the detection of prevalent HIV-1 & HIV-2 antigens is also possible. This again allows early-detection and produces clinically relevant results for a total cost of about $5 per test which is 10 times cheaper than a gp24 HIV-1 PCR test conducted at a lab in India. Moreover, current PCR tests are unable to distinguish between HIV-1 and HIV-2, which is possible with the illustrated embodiment.

The computer-controlled cellphone or smart device has become a fundamental part of the human experience in the 21st century. A global citizen is more likely to use a smartphone than a computer or a car. The illustrated embodiment has been developed to operate in tandem with a smart device through the use of an application available to iPhone and Android devices in order to keep the cost per test down by not having to implement screens, Wi-Fi receivers, and many other peripherals found in everyday smart devices. Thus, system 10 is provided with a smart device connector 50 among its user interface options to allow direct wire, Wi-Fi or blue tooth connection thereto. In this manner the measurements of system 10 can automatically be communicated to the cloud or other network for further analysis and utilization.

CONCLUSION

It may now be appreciated that the illustrated embodiments of the invention include an apparatus for performing a portable, fast, field assay of a small sample of a biological analyte having a microfluidic cartridge used with a smart device. The apparatus includes a functionalized shear horizontal surface acoustic wave (SAW) detector having a plurality of channels including at least one functionalized sensing lane and including at least one reference lane, and a closed microfluidic circuit fluidicly communicated with the shear horizontal surface acoustic wave (SAW) detector, the closed microfluidic circuit for mixing and recirculating the analyte with a buffer with functionalized magnetic beads included within the microfluidic circuit through the sensing and reference lanes of the shear horizontal surface acoustic wave (SAW) detector. It is to be understood that other types of detectors now known or later developed which have the needed limit of detection and field usability may be substituted for a SAW detector.

The closed microfluidic circuit includes a syringe reservoir for receiving the sample of biological analyte to be tested. A pump reservoir with a syringe pump is fluidicly communicated with the syringe reservoir for drawing the sample from the syringe reservoir into a buffer in the pump reservoir. The syringe pump pressurizes the sample of biological analyte and the buffer for recirculation through closed microfluidic circuit.

A mixing reservoir is fluidicly communicated with the pump reservoir. The mixing reservoir includes an active mixer, a predetermined capture antibody and functionalized magnetic beads for mass amplification, the buffer, the predetermined capture antibody and functionalized magnetic beads are mixed into a homogenized mixture wherein an analyte-magnetic bead half sandwich is formed.

A separation reservoir is fluidicly communicated with the mixing reservoir. The separation reservoir includes a membrane for filtering out cellular constituents from the homogenized mixture.

A sensing chamber is fluidicly communicated with the separation reservoir. The sensing chamber includes the shear horizontal surface acoustic wave (SAW) detector and a magnetic source, the analyte-magnetic bead half sandwich being driven by the magnetic source into contact with the functionalized sensing lane of the shear horizontal surface acoustic wave (SAW) detector to form an immunoassay sandwich including the functionalized shear horizontal surface acoustic wave (SAW) detector, an orthogonal capture antibody and the analyte-magnetic bead half sandwich bound to the orthogonal capture antibody.

The apparatus may further include a SAW interface circuit coupled to the shear horizontal surface acoustic wave (SAW) detector, a microcontroller coupled to the SAW interface circuit for controlling the SAW detector through the SAW interface circuit and for data processing an output assay signal from the SAW detector, and a user interface communicated with the microcontroller for providing user input and for providing user output through the smart device.

The magnetic source in one embodiment may be a first electromagnet for separating the captured magnetic beads combined with the analyte from uncaptured magnetic beads not combined with the analyte, a second electromagnet for disposing the captured magnetic beads on at least one functionalized sensing lane of the shear horizontal surface acoustic wave (SAW) detector to allow conjugation of the functionalized captured magnetic beads with the at least one functionalized sensing lane, and a third electromagnet for removing uncaptured magnetic beads and other noninteracting components of the analyte or buffer from the at least one functionalized sensing lane to allow a final measurement to be made.

In another embodiment the magnetic source is a permanent magnetic movable with respect to the at least one functionalized sensing lane of the functionalized shear horizontal surface acoustic wave (SAW) detector.

The membrane is a double membrane through which the homogenized mixture of buffer and analyte-magnetic bead half sandwich is transferred, but which filters out cellular components of the sample.

The apparatus may further include a bubble trap.

The syringe pump and active mixer may be a piezo-pump and piezo-mixer.

The closed microfluidic circuit fluidicly for mixing and recirculating the analyte with a buffer with functionalized magnetic beads recirculates the homogenized mixture of buffer, uncaptured analyte, functionalized magnetic beads, and analyte-magnetic bead half sandwiches through the closed microfluidic circuit a multiplicity of times within a predetermined time period less than one hour in duration.

More specifically the closed microfluidic circuit for mixing and recirculating recirculates the homogenized mixture of buffer, uncaptured analyte, functionalized magnetic beads, and analyte-magnetic bead half sandwiches through the closed microfluidic circuit at least 50 times within less than or equal to a 10-minute duration.

The analyte and buffer are typically combined in the microfluidic chamber using a sample size of the order of 50 µL, namely 40-60 µL, in an amount of buffer of the order of 100 µL, namely 50-150 µL.

The apparatus may further include peripherals coupled to the microcontroller including a memory, a temperature and humidity module, a real time clock, a cooling fan, and an in-circuit serial programming ICSP module.

The user interface includes a Wi-Fi module and antenna coupled to the Wi-Fi module, a capacitive touch screen, a color thin-film transistor display and a graphic controller with memory coupled to the thin-film transistor display with a backlight source.

The user interface may also include an audio module with a speaker coupled thereto, a serial data card interface, an inertial motion unit, at least one RGB LED, and at least one program switch.

The SAW interface circuit includes a clock oscillator, an RF synthesizer coupled to the clock oscillator, a low pass filter and splitter having an input coupled to the RF synthesizer and an output coupled to the SAW detector, a phase/gain detector coupled to the low pass filter and splitter and having a data input coupled to the SAW detector, an analog-to-digital converter having an input coupled to an output of the phase/gain detector and having an output coupled to the microcontroller, a pump driver, and a motor with a motor driver for mechanically loading the microfluidic cartridge.

More specifically the illustrated embodiments of the invention include a cartridge combinable with a smart device which is capable of communicating with a network, the cartridge for performing a portable, fast, field assay of an analyte in a biological sample. The cartridge has a closed microfluidic circuit and a detector. The closed microfluidic circuit homogenously mixes the analyte with a buffer, a predetermined antibody and functionalized magnetic beads capable of being specifically combined with the analyte into a analyte-magnetic bead half sandwich, filters the analyte, buffer, predetermined antibody and functionalized magnetic beads, and analyte combined into a analyte-magnetic bead half sandwich from other constituents of the sample, and recirculates the analyte, buffer, predetermined antibody and functionalized magnetic beads, and analyte combined into a analyte-magnetic bead half sandwich through the microfluidic circuit under pressure a predetermined number of times within a predetermined time period. The detector is fluidly communicated with the microfluidic circuit in which the analyte is combined with the analyte-magnetic bead half sandwich and is driven toward the detector by a magnetic source, where an immunoassay sandwich is formed in or on the detector and sensed by the detector.

The cartridge may further include a microcontroller coupled to detector for controlling the detector and for data processing an output assay signal from the detector; and a user interface communicated with the microcontroller for providing user input and for providing user output through the smart device to the network.

Still further the illustrated embodiments of the invention encompass a method of operating a medically diagnostic cartridge used with a smart device capable of communicating with a network. The medically diagnostic cartridge performs a portable, fast, field assay of an analyte in a sample. The method includes the steps of mixing the analyte, functionalized magnetic beads, and buffer into a homogenous mixture, wherein at least some of the functionalized magnetic beads capture the analyte to form an analyte-magnetic bead half sandwich, transferring the analyte, buffer and functionalized magnetic beads toward a detector, selectively disposing the captured magnetic beads into the detector to allow conjugation of the analyte-magnetic bead half sandwich with a functionalized portion of the detector to form an immunoassay sandwich, and detecting the presence and/or amount of immunoassay sandwich formed in or on the detector to generate a diagnostic output.

The method may further include the step of recirculating the homogenized mixture a predetermined number of times through the cartridge in a predetermined time period and repeating the steps of mixing the analyte, functionalized magnetic beads, and buffer into a homogenous mixture, wherein at least some of the functionalized magnetic beads capture the analyte to form an analyte-magnetic bead half sandwich, transferring the analyte, buffer and functionalized magnetic beads toward a detector, selectively disposing the captured magnetic beads into the detector to allow conjugation of the analyte-magnetic bead half sandwich with a functionalized portion of the detector to form an immunoassay sandwich, and detecting the presence and/or amount of immunoassay sandwich formed in or on the detector to generate a diagnostic output.

The method may further include the step of removing uncaptured magnetic beads and other noninteracting components of the analyte or buffer from the mixture detector before detecting the presence and/or amount of immunoassay sandwich formed in or on the detector to generate a diagnostic output.

The method may further include the step of removing nonspecifically bound mass amplifiers from the homogenous mixture and/or detector to reduce generation of false positive diagnostic output.

Many alterations and modifications may be made by those having ordinary skill in the art without departing from the spirit and scope of the embodiments. Therefore, it must be understood that the illustrated embodiment has been set forth only for the purposes of example and that it should not be taken as limiting the embodiments as defined by the following embodiments and its various embodiments.

Therefore, it must be understood that the illustrated embodiment has been set forth only for the purposes of example and that it should not be taken as limiting the embodiments as defined by the following claims. For example, notwithstanding the fact that the elements of a claim are set forth below in a certain combination, it must be expressly understood that the embodiments include other combinations of fewer, more or different elements, which are disclosed in above even when not initially claimed in such combinations. A teaching that two elements are combined in a claimed combination is further to be understood as also allowing for a claimed combination in which the two elements are not combined with each other but may be used alone or combined in other combinations. The excision of any disclosed element of the embodiments is explicitly contemplated as within the scope of the embodiments.

The words used in this specification to describe the various embodiments are to be understood not only in the sense of their commonly defined meanings, but to include by special definition in this specification structure, material or acts beyond the scope of the commonly defined meanings. Thus, if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person: with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the embodiments.

We claim:

1. An apparatus for performing a portable, fast, field assay of a sample of a biological analyte having a microfluidic cartridge used with a smart device comprising:
    a functionalized shear horizontal surface acoustic wave (SAW) detector having a plurality of channels including at least one functionalized sensing lane and including at least one reference lane;
    a closed microfluidic circuit fluidically communicated with the shear horizontal surface acoustic wave (SAW) detector, the closed microfluidic circuit for mixing and recirculating the analyte with a buffer with functionalized magnetic beads included within the microfluidic circuit through the sensing and reference lanes of the shear horizontal surface acoustic wave (SAW) detector;
    a SAW interface circuit coupled to the SAW detector; and
    a microcontroller coupled to the SAW interface circuit for controlling the SAW detector through the SAW interface circuit and for data processing an output assay signal from the SAW detector,
    where the SAW interface circuit comprises a clock oscillator, an RF synthesizer coupled to the clock oscillator, a low pass filter and splitter having an input coupled to the RF synthesizer and an output coupled to the SAW detector, a phase/gain detector coupled to the low pass filter and the splitter and having a data input coupled to the SAW detector, an analog-to-digital converter having an input coupled to an output of the phase/gain detector and having an output coupled to the microcontroller, a pump driver, and a motor with a motor driver for mechanically loading a microfluidic cartridge, and
    where the closed microfluidic circuit comprises:
    a syringe reservoir for receiving the sample to be tested;
    a pump reservoir with a syringe pump fluidicly communicated with the syringe reservoir for drawing the sample biological analyte from the syringe reservoir into a buffer in the pump reservoir, the syringe pump pressurizing the sample of biological analyte and the buffer for recirculation through closed microfluidic circuit;
    a mixing reservoir fluidically communicated with the pump reservoir, the mixing reservoir including an active mixer, a predetermined capture antibody and functionalized magnetic beads for mass amplification, the buffer, the predetermined capture antibody and functionalized magnetic beads being mixed into a homogenized mixture wherein an analyte-magnetic bead half sandwich is formed;
    a separation reservoir fluidically communicated with the mixing reservoir, the separation reservoir comprising a membrane for filtering out cellular constituents from the homogenized mixture; and a sensing chamber fluidicly communicated with the separation reservoir, the sensing chamber including the shear horizontal surface acoustic wave (SAW) detector and a magnetic source, the analyte-magnetic bead half sandwich being driven by the magnetic source into contact with the functionalized sensing lane of the shear horizontal surface acoustic wave (SAW) detector to form an immunoassay sandwich including the functionalized shear horizontal surface acoustic wave (SAW) detector, an orthogonal capture antibody and the analyte-magnetic bead half sandwich bound to the orthogonal capture antibody.

2. The apparatus of claim 1 further comprising a user interface communicated with the microcontroller for providing user input and for providing user output through the smart device.

3. The apparatus of claim 1 where the magnetic source comprises:
a first electromagnet for separating the captured magnetic beads combined with the analyte from uncaptured magnetic beads not combined with the analyte;
a second electromagnet for disposing the captured magnetic beads on at least one functionalized sensing lane of the shear horizontal surface acoustic wave (SAW) detector to allow conjugation of the functionalized captured magnetic beads with the at least one functionalized sensing lane; and
a third electromagnet for removing uncaptured magnetic beads and other noninteracting components of the analyte or buffer from the at least one functionalized sensing lane to allow a final measurement to be made.

4. The apparatus of claim 1 where the magnetic source comprises a permanent magnetic movable with respect to the at least one functionalized sensing lane of the functionalized shear horizontal surface acoustic wave (SAW) detector.

5. The apparatus of claim 1 where the membrane comprises a double membrane through which the homogenized mixture of buffer and analyte-magnetic bead half sandwich is transferred, but which filters out cellular components of the sample.

6. The apparatus of claim 1 further comprising a bubble trap.

7. The apparatus of claim 1 where the syringe pump and active mixer comprises a piezo-pump and piezo-mixer.

8. The apparatus of claim 1 where the closed microfluidic circuit for mixing and recirculating the analyte with a buffer with functionalized magnetic beads recirculates the homogenized mixture of buffer, uncaptured analyte, functionalized magnetic beads, and analyte-magnetic bead half sandwiches through the closed microfluidic circuit a multiplicity of times within a predetermined time period less than one hour in duration.

9. The apparatus of claim 8 where the closed microfluidic circuit for mixing and recirculating recirculates the homogenized mixture of buffer, uncaptured analyte, functionalized magnetic beads, and analyte-magnetic bead half sandwiches through the closed microfluidic circuit at least 50 times within less than or equal to a 10-minute duration.

10. The apparatus of claim 1 where the analyte and buffer are combined in the microfluidic chamber using a sample size of the order of 50 µL in an amount of buffer of the order of 100 µL.

11. The apparatus of claim 1 further comprising peripherals coupled to the microcontroller including a memory, a temperature and humidity module, a real time clock, a cooling fan, and an in-circuit serial programming ICSP module.

12. The apparatus of claim 2 where the user interface comprises a Wi-Fi module and antenna coupled to the Wi-Fi module, a capacitive touch screen, a color thin-film transistor display and a graphic controller with memory coupled to the thin-film transistor display with a backlight source.

13. The apparatus of claim 12 where the user interface comprises an audio module with a speaker coupled thereto, a serial data card interface, an inertial motion unit, at least one RGB LED, and at least one program switch.

14. A cartridge combinable with a smart device which is capable of communicating with a network, the cartridge for performing a portable, fast, field assay of an analyte in a biological sample comprising:
a closed microfluidic circuit which homogenously mixes the analyte with a buffer, a predetermined antibody and functionalized magnetic beads capable of being specifically combined with the analyte into a analyte-magnetic bead half sandwich, which filters the analyte, buffer, predetermined antibody and functionalized magnetic beads, and analyte combined into a analyte-magnetic bead half sandwich from other constituents of the sample, and which recirculates the analyte, buffer, predetermined antibody and functionalized magnetic beads, and analyte combined into a analyte-magnetic bead half sandwich through the microfluidic circuit under pressure a predetermined number of times within a predetermined time period;
a detector fluidly communicated with the microfluidic circuit in which the analyte is combined with the analyte-magnetic bead half sandwich and is driven toward the detector by a magnetic source, where an immunoassay sandwich is formed in or on the detector and sensed by the detector;
an interface circuit coupled to the detector; and
a microcontroller coupled to the interface circuit configured to control the detector through the interface circuit and for data processing an output assay signal from the detector,
where the interface circuit comprises a clock oscillator, an RF synthesizer coupled to the clock oscillator, a low pass filter and splitter having an input coupled to the RE synthesizer and an output coupled to the detector, a phase/gain detector coupled to the low pass filter and the splitter and having a data input coupled to the detector, an analog-to-digital converter having an input coupled to an output of the phase/gain detector and having an output coupled to the microcontroller, a pump driver, and a motor with a motor driver for mechanically loading a microfluidic cartridge.

15. The cartridge of claim 14 further comprising a user interface communicated with the microcontroller for providing user input and for providing user output through the smart device to the network.

16. The cartridge of claim 14 where the closed microfluidic circuit comprises:
a syringe reservoir for receiving the sample to be tested;
a pump reservoir with a syringe pump fluidicly communicated with the syringe reservoir for drawing the sample from the syringe reservoir into a buffer in the pump reservoir, the syringe pump pressurizing the sample and the buffer for recirculation through closed microfluidic circuit;
a mixing reservoir fluidly communicated with the pump reservoir, the mixing reservoir including an active mixer, a predetermined capture antibody and functionalized magnetic beads for mass amplification, the buffer, the predetermined capture antibody and functionalized magnetic beads being mixed into a homogenized mixture wherein an analyte-magnetic bead half sandwich is formed;

a separation reservoir fluidicly communicated with the mixing reservoir, the separation reservoir include a membrane for filtering out cellular constituents from the homogenized mixture; and a sensing chamber fluidicly communicated with the separation reservoir, the sensing chamber including the detector, which comprises a shear horizontal surface acoustic wave (SAW) detector and a magnetic source, the analyte-magnetic bead half sandwich being driven by the magnetic source into contact with the functionalized sensing lane of the shear horizontal surface acoustic wave (SAW) detector to form an immunoassay sandwich including the functionalized shear horizontal surface acoustic wave (SAW) detector, an orthogonal capture antibody and the analyte-magnetic bead half sandwich bound to the orthogonal capture antibody.

17. The cartridge of claim 16 where the magnetic source comprises a movable permanent magnet for separating the captured magnetic beads combined with the analyte from uncaptured magnetic beads not combined with the analyte, for disposing the captured magnetic beads into the detector to allow conjugation of the functionalized captured magnetic beads with the detector, and for removing uncaptured magnetic beads and other noninteracting components of the analyte or buffer from the detector to allow a final measurement to be made.

18. The cartridge of claim 14 where the smart device provides software-controlled, user input control and data functions and provides software-controlled user output data functions for the cartridge.

* * * * *